(12) United States Patent (10) Patent No.: US 12,580,531 B2
Tahara et al. (45) Date of Patent: Mar. 17, 2026

(54) RADIO FREQUENCY CIRCUIT AND COMMUNICATION DEVICE

(71) Applicant: Murata Manufacturing Co., Ltd., Nagaokakyo (JP)

(72) Inventors: Kenji Tahara, Nagaokakyo (JP); Yoshiaki Sukemori, Nagaokakyo (JP); Kae Yamamoto, Nagaokakyo (JP); Ryo Wakabayashi, Nagaokakyo (JP); Isao Takenaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 321 days.

(21) Appl. No.: 18/518,615

(22) Filed: Nov. 24, 2023

(65) Prior Publication Data

US 2024/0088841 A1 Mar. 14, 2024

Related U.S. Application Data

(63) Continuation of application No. PCT/JP2022/011309, filed on Mar. 14, 2022.

(30) Foreign Application Priority Data

Jun. 2, 2021 (JP) ................................. 2021-093022
Oct. 22, 2021 (JP) ................................. 2021-172979

(51) Int. Cl.
H03F 3/19 (2006.01)
H03F 1/56 (2006.01)
H04B 1/40 (2015.01)
(52) U.S. Cl.
CPC ............... H03F 3/19 (2013.01); H03F 1/565 (2013.01); H04B 1/40 (2013.01); H03F 2200/387 (2013.01); H03F 2200/451 (2013.01)

(58) Field of Classification Search
CPC .............. H03F 3/19; H03F 1/565; H04B 1/40
See application file for complete search history.

(56) References Cited

U.S. PATENT DOCUMENTS

2014/0087671 A1* 3/2014 Mostov ................. H03F 1/0238
455/78
2014/0295781 A1* 10/2014 Kawano .................. H03F 3/245
455/127.2

(Continued)

FOREIGN PATENT DOCUMENTS

JP 2005-536922 A 12/2005
JP 2013-085179 A 5/2013
JP 2018-137566 A 8/2018

OTHER PUBLICATIONS

International Search Report and Written Opinion mailed on Jun. 21, 2022, received for PCT Application PCT/JP2022/011309, filed on Mar. 14, 2022, 8 pages including English Translation.

*Primary Examiner* — David Bilodeau
(74) *Attorney, Agent, or Firm* — XSENSUS LLP

(57) ABSTRACT

A radio frequency circuit includes carrier amplifiers and peak amplifiers, transformers, a signal output terminal connected to a first end of an output-side coil, an LC series circuit, and a capacitor. An input-side coil is connected, at its first end, to the carrier amplifier, and is connected, at its second end, to the carrier amplifier. An input-side coil is connected, at its first end, to the peak amplifier, and is connected, at its second end, to the peak amplifier. The LC series circuit is connected between the peak amplifier and the ground. The capacitor is connected to a second end of the output-side coil and a first end of an output-side coil. The output-side coil is connected, at its second end, to the ground.

20 Claims, 18 Drawing Sheets

(56) References Cited

U.S. PATENT DOCUMENTS

| | | | |
|---|---|---|---|
| 2016/0142020 A1* | 5/2016 | Wang | H03F 3/19 |
| | | | 330/295 |
| 2017/0222605 A1* | 8/2017 | Kaczman | H03F 1/565 |
| 2018/0241362 A1* | 8/2018 | Takenaka | H03F 1/0288 |
| 2022/0247360 A1* | 8/2022 | Hampel | H04B 1/40 |
| 2023/0216456 A1* | 7/2023 | Imai | H03F 3/245 |
| | | | 330/295 |
| 2023/0261622 A1* | 8/2023 | Imai | H03F 3/245 |
| | | | 330/295 |
| 2023/0318546 A1* | 10/2023 | Tanaka | H03F 1/0288 |
| | | | 330/252 |

* cited by examiner

AMPLIFIER CIRCUIT OF RELATED ART 500

———— CARRIER AMPLIFIER 11
— — — CARRIER AMPLIFIER 12
—··—··— PEAK AMPLIFIER 13
— — — — PEAK AMPLIFIER 14

AMPLIFIER CIRCUIT ACCORDING TO
SEVENTH MODIFIED EXAMPLE 10B

———— CARRIER AMPLIFIER 11
— — — CARRIER AMPLIFIER 12
—··—··— PEAK AMPLIFIER 13
— — — — PEAK AMPLIFIER 14

RADIO FREQUENCY CIRCUIT AND COMMUNICATION DEVICE

CROSS-REFERENCE TO RELATED APPLICATIONS

This is a continuation application of PCT/JP2022/011309, filed on Mar. 14, 2022, designating the United States of America, which is based on and claims priority to Japanese Patent Application No. JP 2021-172979 filed on Oct. 22, 2021; and Japanese Patent Application No. JP 2021-093022 filed on Jun. 2, 2021. The entire contents of the above-identified applications, including the specifications, drawings and claims, are incorporated herein by reference in their entirety.

TECHNICAL FIELD

The present disclosure relates to a radio frequency circuit and a communication device.

BACKGROUND ART

Patent Document 1 discloses a power amplifier circuit including a first amplifier (carrier amplifier), a first transformer, a second amplifier (peak amplifier), and a second transformer. The first amplifier amplifies a first signal, which is distributed from an input signal, in a range in which the power level of the input signal is higher than or equal to a first level, and outputs a second signal.

The first transformer receives the second signal. The second amplifier amplifies a third signal, which is distributed from the input signal, in a range in which the power level of the input signal is higher than or equal to a second level that is higher than the first level, and outputs a fourth signal. The second transformer receives the fourth signal.

CITATION LIST

Patent Document

Patent Document 1: Japanese Unexamined Patent Application Publication No. 2018-137566

SUMMARY OF DISCLOSURE

Technical Problem

The power amplifier circuit disclosed in Patent Document 1 needs means for suppressing higher harmonics, to improve the linearity of high-output radio frequency signals from the first amplifier and the second amplifier.

However, suppression of higher harmonics both in operation and in non-operation of the first amplifier and the second amplifier may degrade the transmission characteristics of the fundamental wave.

The present disclosure is to made to solve the issue described above, so as to provide a radio frequency circuit and a communication device having multiple amplifying devices and transformers which enable suppression of a harmonic without degradation of the transmission characteristics of the fundamental wave.

Solution to Problem

A radio frequency circuit according to an aspect of the present disclosure includes a first amplifying device, a second amplifying device, a third amplifying device, a fourth amplifying device, a first transformer having a first input-side coil and a first output-side coil, a second transformer having a second input-side coil and a second output-side coil, a signal output terminal connected to a first end of the first output-side coil, an LC series circuit, and a first capacitive device. Each of the first amplifying device and the second amplifying device is a carrier amplifier. Each of the third amplifying device and the fourth amplifying device is a peak amplifier. The first input-side coil is connected, at a first end thereof, to an output terminal of the first amplifying device, and is connected, at a second end thereof, to an output terminal of the second amplifying device. The second input-side coil is connected, at a first end thereof, to an output terminal of the third amplifying device, and is connected, at a second end thereof, to an output terminal of the fourth amplifying device. The LC series circuit is connected either between the output terminal of the third amplifying device and a ground or between the output terminal of the fourth amplifying device and a ground. The first capacitive device is connected, at a first end thereof, to a second end of the first output-side coil, and is connected, at a second end thereof, to a first end of the second output-side coil. The second output-side coil is connected, at a second end thereof, to a ground.

A radio frequency circuit according to an aspect of the present disclosure includes a first amplifying device, a second amplifying device, a first transformer having a first input-side coil and a first output-side coil, a second transformer having a second input-side coil and a second output-side coil, a signal output terminal connected to a first end of the first output-side coil, an LC series circuit, and a first capacitive device. The first amplifying device is a carrier amplifier. The second amplifying device is a peak amplifier. The first input-side coil is connected, at a first end thereof, to an output terminal of the first amplifying device, and is connected, at a second end thereof, to a ground. The second input-side coil is connected, at a first end thereof, to an output terminal of the second amplifying device, and is connected, at a second end thereof, to a ground. The LC series circuit is connected between the output terminal of the second amplifying device and a ground. The first capacitive device is connected, at a first end thereof, to a second end of the first output-side coil, and is connected, at a second end thereof, to a first end of the second output-side coil. The second output-side coil is connected, at a second end thereof, to a ground.

Advantageous Effects of Disclosure

The present disclosure may provide a radio frequency circuit and a communication device having multiple amplifying devices and transformers which enable suppression of a harmonic without degradation of the transmission characteristics of the fundamental wave.

DESCRIPTION OF EMBODIMENTS

Figure 1:
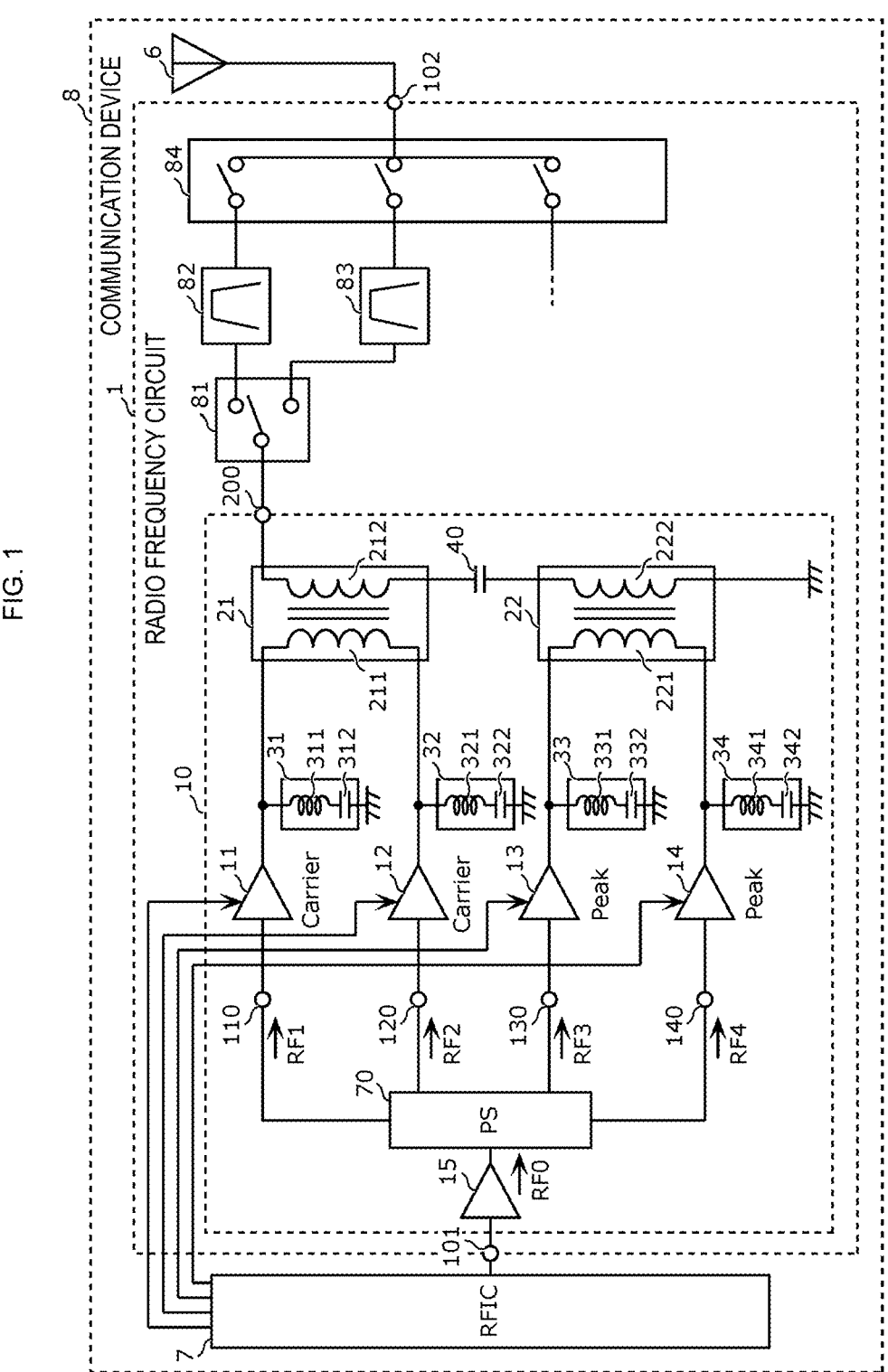
FIG. 1 is a diagram illustrating the circuit configuration of a radio frequency circuit and a communication device according to an embodiment.

Embodiments of the present disclosure will be described below in detail by using the drawings. The embodiments below each describe a comprehensive or specific example. Values, shapes, materials, components, the layout and the connection forms of components, and the like, which are described in the embodiments below, are exemplary, and are not intended to limit the present disclosure.

The figures are schematic views with appropriate emphasis, abbreviation, or adjustment of ratios for illustration of the present disclosure, and are not necessarily illustrated strictly. The shapes, the positional relationship, and the ratios may be different from the actual ones. In the figures, substantially the same configurations are designated with the same reference numerals. Repeated description may be skipped or simplified.

In the present disclosure, "to be connected" means, not only the case of direct connection using connection terminals and/or wiring conductors, but also the case of electrical connection via other circuit devices. "To be connected between A and B" means connection to A and B on a path connecting A to B.

In the present disclosure, a "signal path" means a transmission line formed, for example, of wiring through which radio frequency signals are propagated, electrodes which are directly connected to the wiring, and terminals connected directly to the wiring or the electrodes.

In the configurations of the present disclosure, "in plan view" means viewing an object subjected to orthogonal projection to the xy plane from the z-axis positive side. "To dispose a component on a principal surface of a substrate" encompasses, in addition to placement of a component on a principal surface of a substrate in the state in which the component is in contact with the principal surface, placement of a component above a principal surface in the state in which the component is not in contact with the principal surface, and placement of a component in the state in which a part of the component is embedded in a substrate from the principal surface side.

EMBODIMENT

[1. The Circuit Configuration of a Radio Frequency Circuit 1 and a Communication Device 8]

The circuit configuration of a radio frequency circuit 1 and a communication device 8 according to the present embodiment will be described by referring to FIG. 1. FIG. 1 is a diagram illustrating the circuit configuration of the radio frequency circuit 1 and the communication device 8 according to the embodiment.

[1.1 The Circuit Configuration of the Communication Device 8]

The circuit configuration of the communication device 8 will be described. As illustrated in FIG. 1, the communication device 8 according to the present embodiment includes the radio frequency circuit 1, an antenna 6, and an RF signal processing circuit (RFIC) 7.

The radio frequency circuit 1 transports radio frequency signals between the antenna 6 and the RFIC 7. The detailed circuit configuration of the radio frequency circuit 1 will be described below.

The antenna 6, which is connected to an antenna connection terminal 102 of the radio frequency circuit 1, transmits radio frequency signals, which are output from the radio frequency circuit 1, and receives radio frequency signals from the outside for output to the radio frequency circuit 1.

The RFIC 7 is an exemplary signal processing circuit which processes radio frequency signals. Specifically, the RFIC 7 performs signal processing such as down-converting on a receive signal received through a receive path of the radio frequency circuit 1, and outputs the receive signal, which is generated through the signal processing, to a baseband signal processing circuit (BBIC, not illustrated). The RFIC 7 performs signal processing such as upconverting on a transmit signal received from the BBIC, and outputs the transmit signal, which is generated through the signal processing, to a transmit path of the radio frequency circuit 1. The RFIC 7 has a controller which controls, for example, switches and amplifying devices included in the radio frequency circuit 1. Some or all of the functions, as the controller, of the RFIC 7 may be implemented outside the RFIC 7, and, for example, may be implemented in the BBIC or the radio frequency circuit 1.

The RFIC 7 also has functions as a controller which controls the power supply voltage Vcc and the bias voltage Vbias which are supplied to each amplifier included in the radio frequency circuit 1. Specifically, the RFIC 7 outputs digital control signals to the radio frequency circuit 1. Each amplifier in the radio frequency circuit 1 is supplied with the power supply voltage Vcc and the bias voltage Vbias which are controlled by using the corresponding digital control signal.

The RFIC 7 also has functions as a controller which controls connection in switches 81 and 84, which are included in the radio frequency circuit 1, on the basis of the communication band (frequency band) which is used.

In the communication device 8 according to the present embodiment, the antenna 6 is not a necessary component.

[1.2 the Circuit Configuration of the Radio Frequency Circuit 1]

The circuit configuration of the radio frequency circuit 1 will be described. As illustrated in FIG. 1, the radio frequency circuit 1 includes an amplifier circuit 10, filters 82 and 83, the switches 81 and 84, an input terminal 101, and the antenna connection terminal 102.

The input terminal 101 is connected to the RFIC 7. The antenna connection terminal 102 is connected to the antenna 6.

The amplifier circuit 10 is a Doherty amplifier circuit which amplifies transmit signals, in Band A and Band B, which are received from the input terminal 101. The radio frequency circuit 1 may include, instead of the amplifier circuit 10, a first Doherty amplifier circuit, which amplifies radio frequency signals in Band A, and a second Doherty amplifier circuit, which amplifies radio frequency signals in Band B.

A Doherty amplifier circuit corresponds to an amplifier circuit which uses multiple amplifiers as a carrier amplifier and a peak amplifier to achieve high efficiency. A carrier amplifier in a Doherty amplifier circuit corresponds to an amplifier which operates regardless of the power level, which is low or high, of a radio frequency signal (input). A peak amplifier in a Doherty amplifier circuit corresponds to an amplifier which operates mainly when a radio frequency signal (input) has high power. Therefore, when the input power of a radio frequency signal is low, the radio frequency signal is amplified mainly by the carrier amplifier. When the input power of a radio frequency signal is high, the radio frequency signal is amplified by the carrier amplifier and the peak amplifier, and the amplified signals are combined. Through such an operation, a Doherty amplifier circuit has an increased load impedance, as seen from the carrier amplifier, in low output power, achieving improvement of efficiency in low output power.

In the present embodiment, each of Band A and Band B corresponds to a frequency band which is defined in advance, for example, by a standardization organization (for example, 3GPP (3rd Generation Partnership Project), IEEE (Institute of Electrical and Electronics Engineers)) for a communication system constructed by using radio access technology (RAT). In the present embodiment, examples of a communication system may include, but not limited to, a 4G (4th Generation)-LTE (Long Term Evolution) system, a 5G (5th Generation)-NR (New Radio) system, and a WLAN (Wireless Local Area Network) system.

The filter 82, which is connected between the switches 81 and 84, passes transmit signals in the transmit band of Band A among transmit signals having been amplified by the amplifier circuit 10. The filter 83, which is connected between the switches 81 and 84, passes transmit signals in the transmit band of Band B among transmit signals having been amplified by the amplifier circuit 10.

Each of the filters 82 and 83 may constitute a duplexer with a receive filter, or may constitute a single filter employing transportation in a time division duplex (TDD) system. Based on each of the filters 82 and 83 being a TDD filter, a switch for switching between transmission and reception is disposed either before or after, or both before and after the single filter.

The switch 81 has a common terminal, a first selection terminal, and a second selection terminal. The common terminal is connected to a signal output terminal 200 of the amplifier circuit 10. The first selection terminal is connected to the filter 82. The second selection terminal is connected to the filter 83. In this connection configuration, the switch 81 switches between connection between the amplifier circuit 10 and the filter 82 and connection between the amplifier circuit 10 and the filter 83.

The switch 84, which is an exemplary antenna switch, is connected to the antenna connection terminal 102. The switch 84 switches between connection and disconnection between the antenna connection terminal 102 and the filter 82, and switches between connection and disconnection between the antenna connection terminal 102 and the filter 83.

The radio frequency circuit 1 may include a receive circuit for transporting, to the RFIC 7, receive signals received from the antenna 6. In this case, the radio frequency circuit 1 includes a low-noise amplifier and a receive filter.

An impedance matching circuit may be disposed between the signal output terminal 200 and the antenna connection terminal 102.

The circuit configuration enables the radio frequency circuit 1 to transmit or receive a radio frequency signal in either one of Band A and Band B. Further, the radio frequency circuit 1 may perform transportation of at least one of the types, that is, simultaneous transmission, simultaneous reception, and simultaneous transmission/reception, on radio frequency signals in Band A and Band B.

The radio frequency circuit 1 according to the present disclosure may have any configuration as long as it includes at least the amplifier circuit 10 among the circuit configurations illustrated in FIG. 1.

The circuit configuration of the amplifier circuit 10 will be described in detail.

As illustrated in FIG. 1, the amplifier circuit 10 includes carrier amplifiers 11 and 12, peak amplifiers 13 and 14, a preamplifier 15, a phase-shift circuit 70, transformers 21 and 22, LC series circuits 31, 32, 33, and 34, a capacitor 40, and the signal output terminal 200.

The preamplifier 15 amplifies a radio frequency signal in Band A and/or Band B received from the input terminal 101.

The phase-shift circuit 70 distributes a signal RF0 which is output from the preamplifier 15, and outputs distributed signals RF1, RF2, RF3 and RF4 through terminals 110, 120, 130 and 140 to the carrier amplifiers 11 and 12 and the peak amplifiers 13 and 14, respectively. At that time, the phase-shift circuit 70 adjusts the phases of the signals RF1 to RF4. For example, the phase-shift circuit 70 shifts the signal RF1 by +90° relative to RF0 (90° advance); shifts the signal RF2 by −90° relative to RF0 (90° delay); shifts the signal RF3 by 0° relative to RF0 (no phase shift); and shifts the signal RF4 by +180° relative to RF0 (180° advance).

Thus, RF1 and RF2 may have a phase difference of 180°; RF3 and RF4 may have a phase difference of 180°. That is, the carrier amplifiers 11 and 12 may function as a differential amplifier pair; the peak amplifiers 13 and 14 may function as a differential amplifier pair.

The configuration of the preamplifier 15 and the phase-shift circuit 70 is not limited to the configuration described above. For example, preamplifiers 15 may be disposed before the carrier amplifiers 11 and 12 and the peak amplifiers 13 and 14, respectively. In this case, phase-shift circuits 70 may be disposed before the respective preamplifiers or before the carrier amplifiers 11 and 12 and the peak amplifiers 13 and 14, respectively. The amplifier circuit 10 does not necessarily include the preamplifier 15 and the phase-shift circuit 70.

Each of the carrier amplifiers 11 and 12 and the peak amplifiers 13 and 14 has an amplifier transistor. The amplifier transistor is, for example, a bipolar transistor such as a heterojunction bipolar transistor (HBT) or a field-effect transistor such as a MOSFET (Metal-Oxide-Semiconductor Field Effect Transistor).

The carrier amplifiers 11 and 12, which are an exemplary first amplifying device and an exemplary second amplifying device, respectively, are class A (or class AB) amplifier circuits operable to amplify all the power levels of the signals RF1 and RF2. In particular, the carrier amplifiers 11 and 12 are operable to perform highly efficient amplification in the low output range and the medium output range. The first amplifying device and the second amplifying device according to the present disclosure may have any configuration as long as they are class A (or class AB) amplifier circuits, and are not limited to carrier amplifiers.

The peak amplifiers 13 and 14, which are an exemplary third amplifying device and an exemplary fourth amplifying device, respectively, are, for example, class C amplifier circuits operable to perform amplification in a range in which the power level of the signals RF3 and RF4 is high. The peak amplifiers 13 and 14 operate in a range which is higher than a level of zero and which is at and above the level at which the power level of the signal RF0 is lower by a predetermined level (for example, about 6 dB) relative to the maximum level. A bias voltage lower than the bias voltage applied to the amplifier transistors included in the carrier amplifiers 11 and 12 is applied to the amplifier transistors included in the peak amplifiers 13 and 14. Thus, the higher the power level of the signals RF3 and RF4 is, the lower the output impedance. Thus, the peak amplifiers 13 and 14 are operable to perform amplification with low distortion in the high output range. The third amplifying device and the fourth amplifying device according to the present disclosure may have any configuration as long as they are class C amplifier circuits, and are not limited to peak amplifiers.

The transformer 21, which is an exemplary first transformer, has an input-side coil 211 (first input-side coil) and an output-side coil 212 (first output-side coil). The input-side coil 211 is connected, at its first end, to the output terminal of the carrier amplifier 11, and is connected, at its second end, to the output terminal of the carrier amplifier 12. The output-side coil 212 is connected, at its first end, to the signal output terminal 200, and is connected, at its second end, to a first end of the capacitor 40.

The transformer 22, which is an exemplary second transformer, has an input-side coil 221 (second input-side coil) and an output-side coil 222 (second output-side coil). The input-side coil 221 is connected, at its first end, to the output terminal of the peak amplifier 13, and is connected, at its second end, to the output terminal of the peak amplifier 14. The output-side coil 222 is connected, at its first end, to a second end of the capacitor 40, and is connected, at its second end, to the ground.

According to the connection configuration of the transformers 21 and 22, the voltage of a differential signal, which is output from the carrier amplifiers 11 and 12, and the voltage of a differential signal, which is output from the peak amplifiers 13 and 14, are added together. The combined output signal is output from the signal output terminal 200.

The LC series circuit 31, which is an exemplary first LC series circuit, has an inductor 311 and a capacitor 312 which are connected in series to each other. The LC series circuit 31 is connected between the output terminal of the carrier amplifier 11 and the ground. In the present embodiment, the capacitor 312 among the inductor 311 and the capacitor 312 is connected to the ground side. Alternatively, the inductor 311 may be connected to the ground side.

The LC series circuit 32, which is an exemplary second LC series circuit, has an inductor 321 and a capacitor 322 which are connected in series to each other. The LC series circuit 32 is connected between the output terminal of the carrier amplifier 12 and the ground. In the present embodiment, the capacitor 322 among the inductor 321 and the capacitor 322 is connected to the ground side. Alternatively, the inductor 321 may be connected to the ground side.

The LC series circuit 33, which is an exemplary third LC series circuit, has an inductor 331 (second inductor) and a capacitor 332 (second capacitive device) which are connected in series to each other. The LC series circuit 33 is connected between the output terminal of the peak amplifier 13 and the ground. In the present embodiment, the capacitor 332 among the inductor 331 and the capacitor 332 is connected to the ground side. Alternatively, the inductor 331 may be connected to the ground side.

The LC series circuit 34, which is an exemplary fourth LC series circuit, has an inductor 341 and a capacitor 342 which are connected in series to each other. The LC series circuit 34 is connected between the output terminal of the peak amplifier 14 and the ground. In the present embodiment, the capacitor 342 among the inductor 341 and the capacitor 342 is connected to the ground side. Alternatively, the inductor 341 may be connected to the ground side.

The inductors 311, 321, 331, and 341 may be chip components and planar conductors formed on/in a substrate, or may be formed of wiring such as wires.

The amplifier circuit and the radio frequency circuit according to the present disclosure do not necessarily include the LC series circuits 31 and 32. The amplifier circuit and the radio frequency circuit may have any configuration as long as they include at least one of the LC series circuits 33 and 34.

The capacitor 40, which is an exemplary first capacitive device, is connected, at its first end (one of the electrodes), to the second end of the output-side coil 212, and is connected, at its second end (the other electrode), to the first end of the output-side coil 222. The capacitor 40 may be a chip capacitor, or may include a planar conductor formed inside a substrate.

[1.3 Operations of a Doherty Amplifier Circuit 500]

Operations of a Doherty amplifier circuit of the related art will be described.

Figure 2A:
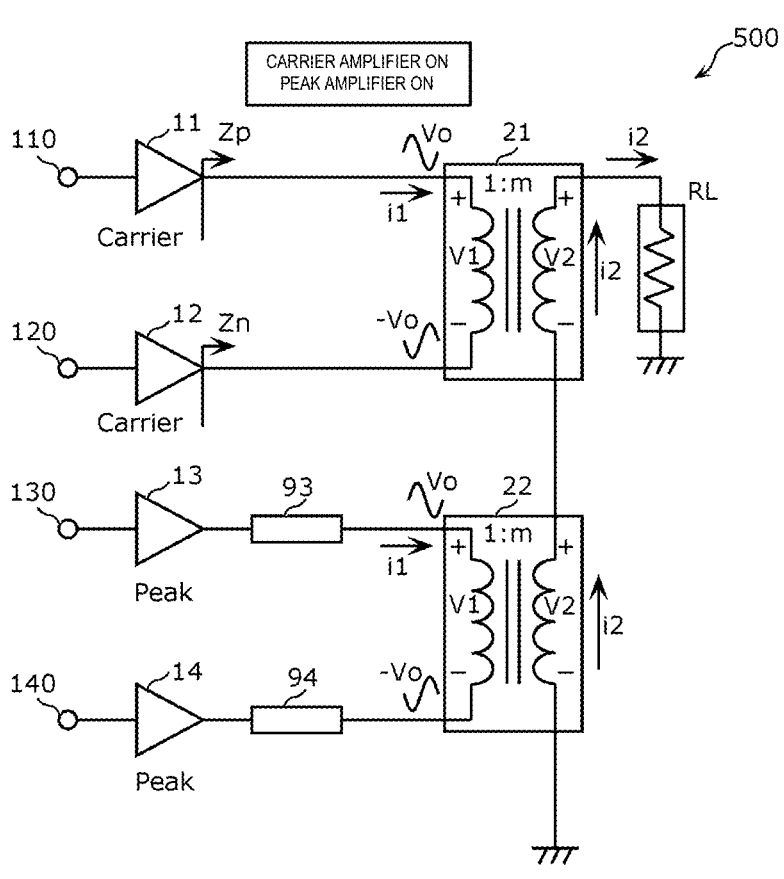
FIG. 2A is a diagram illustrating the circuit state of a Doherty amplifier circuit of the related art in the case of reception of a large signal.
Figure 2B:
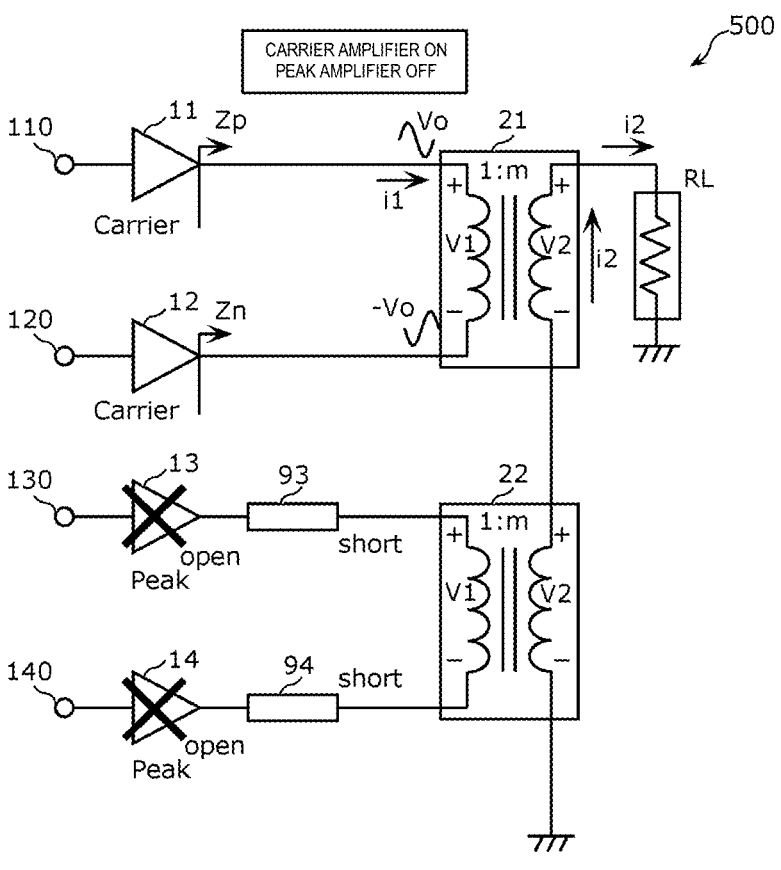
FIG. 2B is a diagram illustrating the circuit state of a Doherty amplifier circuit of the related art in the case of reception of a small signal.

FIG. 2A is a diagram illustrating the circuit state of a Doherty amplifier circuit 500 of the related art in the case of reception of a large signal. FIG. 2B is a diagram illustrating the circuit state of the Doherty amplifier circuit 500 of the related art in the case of reception of a small signal.

The Doherty amplifier circuit 500 of the related art is different from the amplifier circuit 10 according to the embodiment in that the LC series circuits 31 to 34 and the capacitor 40 are not included and in that quarter-wavelength transmission lines 93 and 94 are disposed. The circuit configuration of the amplifier circuit 500 of the related art will be described below by focusing on configurations different from those of the amplifier circuit 10 according to the embodiment.

In the amplifier circuit 500, the capacitor 40 is not disposed, and the second end of the output-side coil 212 is directly connected to the first end of the output-side coil 222.

The quarter-wavelength transmission line 93 is disposed between the output terminal of the peak amplifier 13 and the first end of the input-side coil 221. The quarter-wavelength transmission line 94 is disposed between the output terminal of the peak amplifier 14 and the second end of the input-side coil 221.

As illustrated in FIG. 2A, based on the carrier amplifiers 11 and 12 and the peak amplifiers 13 and 14 operating (are ON) (in the case of reception of a large signal), the output impedance Zp, as seen from the output terminals of the carrier amplifier 11 and the peak amplifier 13 to the load side, and the output impedance Zn, as seen from the output terminals of the carrier amplifier 12 and the peak amplifier 14 to the load side, are expressed in Expression 1. It is assumed that each of the transformers 21 and 22 has a transformation ratio of 1:m. The voltage applied across the input-side coil 211 and the voltage applied across the input-side coil 221 are each represented by V1. The voltage applied across the output-side coil 212 and the voltage applied across the output-side coil 222 are each represented by V2. The current passing through the input-side coil 211 and that through the input-side coil 221 are each represented by i1. The current passing through the output-side coil 212 and that through the output-side coil 222 are each represented by i2. The output voltage of each amplifier is represented by Vo. The impedance of a load connected to the signal output terminal 200 is represented by RL.

[Mah 1]

$$V2 = mV1 = 2mVo, i2 = \frac{1}{m}i1 \qquad \text{(Expression 1)}$$

$$RL = \frac{V2 + V2}{i2} = \frac{4m^2 Vo}{i1}$$

-continued $$Z_p = Z_n = \frac{Vo}{i1} = \frac{RL}{4m^2}$$

As illustrated in FIG. 2B, based on the carrier amplifiers 11 and 12 operating (are ON) and the peak amplifiers 13 and 14 not operating (are OFF) (in the case of reception of a small signal), the output impedance Zp, as seen from the output terminal of the carrier amplifier 11 to the load side, and the output impedance Zn, as seen from the output terminal of the carrier amplifier 12 to the load side, are expressed in Expression 2. The output impedance, as seen from the output terminal of the peak amplifier 13 to the load side, and the output impedance, as seen from the output terminal of the peak amplifier 14 to the load side, are both in the open state.

[Math 2]

$$V2 = mV1 = 2mVo, i2 = \frac{1}{m}i1 \qquad \text{(Expression 2)}$$

$$RL = \frac{V2}{i2} = \frac{2m^2 Vo}{i1}$$

$$Z_p = Z_n = \frac{Vo}{i1} = \frac{RL}{2m^2}$$

As shown by Expression 1 and Expression 2, the output impedance of each of the carrier amplifiers 11 and 12 in the case of reception of a small signal is twice that in the case of reception of a large signal. That is, in the case of reception of a small signal, the peak amplifiers 13 and 14 are off, and the output impedances of the carrier amplifiers 11 and 12 get higher, enabling the amplifier circuit 10 to operate with high efficiency.

In contrast, in the case of reception of a large signal, the carrier amplifiers 11 and 12 and the peak amplifiers 13 and 14 operate, enabling a large power signal to be output. In addition, the output impedances of the peak amplifiers 13 and 14 are low, enabling signal distortion to be suppressed.

The quarter-wavelength transmission line 93 shifts the phase of a signal, which is output from the peak amplifier 13, by −90° (90° delay). The quarter-wavelength transmission line 94 shifts the phase of a signal, which is output from the peak amplifier 14, by −90° (90° delay). The placement of the quarter-wavelength transmission lines 93 and 94 causes the phase of a differential signal, which is output from the carrier amplifiers 11 and 12, to match the phase of a differential signal, which is output from the peak amplifiers 13 and 14. Thus, the voltage of a differential signal, which is output from the carrier amplifiers 11 and 12, and that of a differential signal, which is output from the peak amplifiers 13 and 14, are added by the transformers 21 and 22.

[1.4 Operations of an Amplifier Circuit 600 According to a Comparison Example]

An amplifier circuit 600 according to a comparison example, which has the configuration of the Doherty amplifier circuit of the related art plus an additional configuration for suppressing a harmonic, will be described.

Figure 3A:
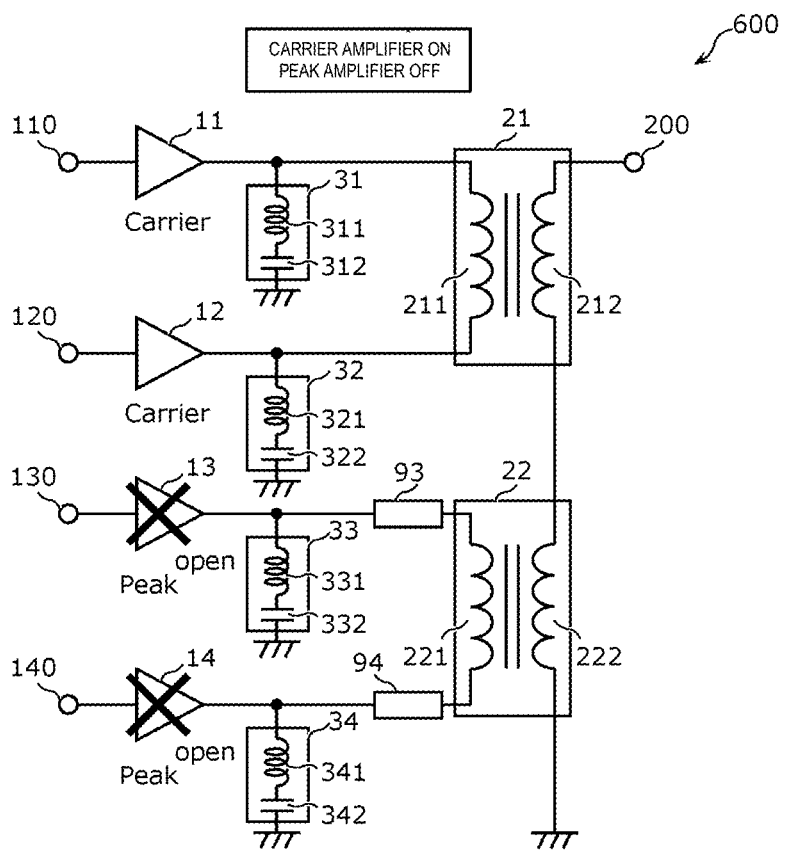
FIG. 3A is a diagram illustrating the circuit configuration of an amplifier circuit according to a comparison example.

FIG. 3A is a diagram illustrating the circuit configuration of the amplifier circuit 600 according to the comparison example. In the amplifier circuit 600 illustrated in FIG. 3A, the LC series circuits 31 to 34 for suppressing second harmonics are added to the amplifier circuit 500 of the related art. The configuration of the LC series circuits 31 to 34 included in the amplifier circuit 600 is the same as that of the LC series circuits 31 to 34 according to the embodiment. The LC series circuits 31 to 34 are circuits for terminating second harmonics of signals which are output from the respective amplifiers. For example, in the LC series circuit 33, the inductance value of the inductor 331 and the capacitance value of the capacitor 332 are set so that the LC series resonant frequency matches the second harmonic of signals which are output from the peak amplifier 13. In the LC series circuits 31, 32, and 34, the inductance values and the capacitance values are set similarly.

Thus, in the amplifier circuit 600, based on the carrier amplifiers 11 and 12 and the peak amplifiers 13 and 14 operating (are ON) (in the case of reception of a large signal), the second harmonics generated by the respective amplifiers may be suppressed.

However, based on the carrier amplifiers 11 and 12 operating (are ON) and the peak amplifiers 13 and 14 not operating (are OFF) (in the case of reception of a small signal), the LC series resonant frequency defined by the LC series circuits 31 to 34 is shifted by a large extent from the frequency of the second harmonic.

Figure 3B:
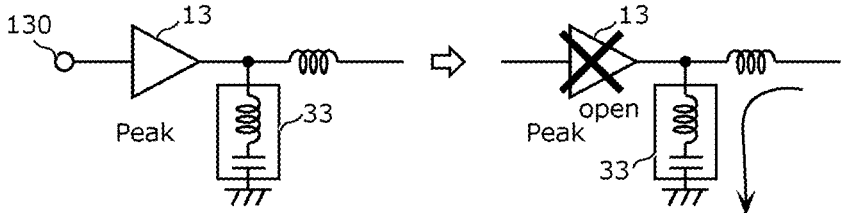
FIG. 3B is a diagram illustrating the equivalent circuit of a path, including an LC series circuit, of an amplifier circuit according to the comparison example in the case where a peak amplifier is off.

FIG. 3B is a diagram illustrating the equivalent circuit of a path, including the LC series circuit 33, of the amplifier circuit 600 according to the comparison example in the case where the peak amplifier is off (in the case of reception of a small signal). The left part in FIG. 3B illustrates the case where the peak amplifier 13 operates (is ON). For the signal path connecting the terminal 130 to the transformer 22, the LC series circuit 33 is operating in resonance at the LC series resonant frequency, which is defined by the inductor 331 and the capacitor 332. In contrast, the right part in FIG. 3B illustrates the case where the peak amplifier 13 does not operate (is OFF). Since no signals flow through the path connecting the terminal 130 to the peak amplifier 13, the LC series circuit 33 operates in resonance at the LC series resonant frequency, which is defined by the inductor 331, the capacitor 332, and the parasitic inductance of the path connecting the peak amplifier 13 to the signal output terminal 200. Therefore, the LC series resonant frequency defined by the LC series circuit 33 is shifted to the low frequency side by the additional parasitic inductance. This causes a concern that the second harmonic generated by the carrier amplifiers 11 and 12 is not suppressed and that the fundamental wave on the lower frequency side is suppressed.

[1.5 Operations of the Amplifier Circuit 10 According to the Embodiment]

Operations of the amplifier circuit 10 according to the embodiment will be described.

Figure 4A:
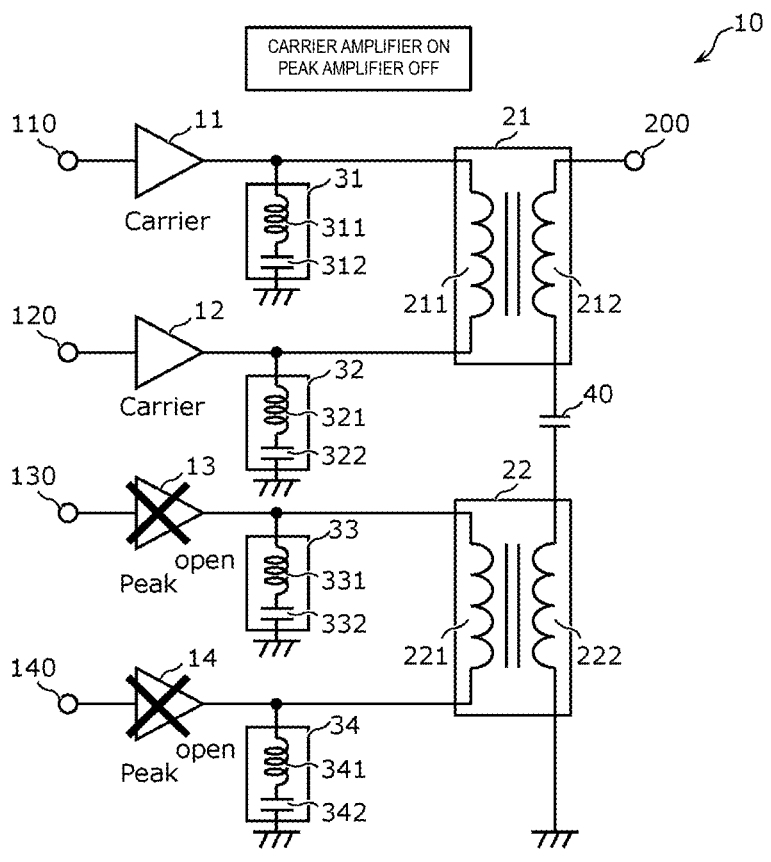
FIG. 4A is a diagram illustrating the circuit configuration of an amplifier circuit according to the embodiment.
Figure 4B:
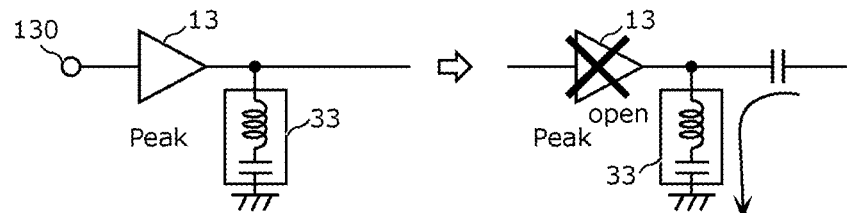
FIG. 4B is a diagram illustrating the equivalent circuit of a path, including an LC series circuit, of an amplifier circuit according to the embodiment in the case where a peak amplifier is off.
Figure 5:
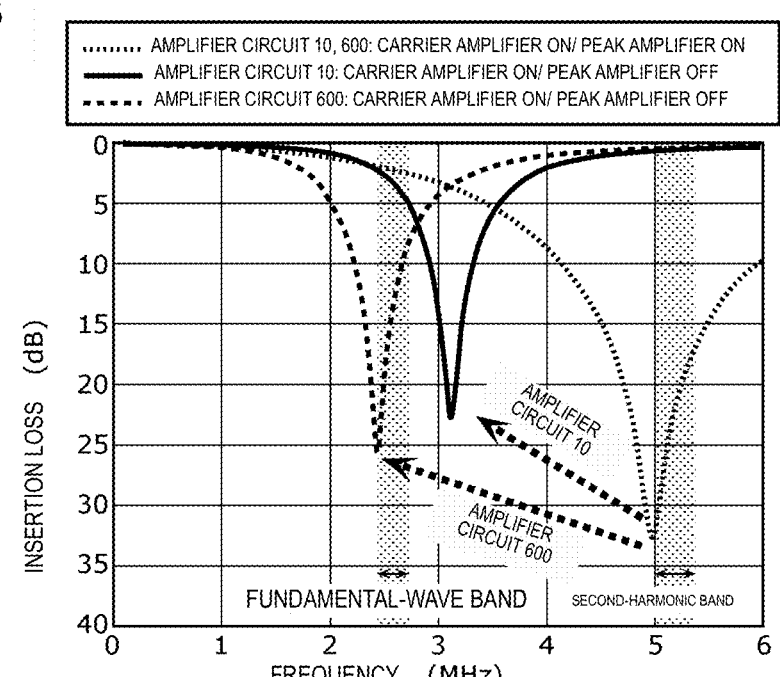
FIG. 5 is a graph showing comparison between the frequency characteristics of an LC series circuit according to the embodiment and those according to the comparison example.

FIG. 4A is a diagram illustrating the circuit configuration of the amplifier circuit 10 according to the embodiment. FIG. 4B is a diagram illustrating the equivalent circuit of a path, including the LC series circuit 33, of the amplifier circuit 10 according to the embodiment in the case where a peak amplifier is off. FIG. 5 is a graph showing comparison between the frequency characteristics of an LC series circuit of the amplifier circuit 10 according to the embodiment and those of the amplifier circuit 600 according to the comparison example. Specifically, FIG. 5 illustrates the bandpass characteristics of the LC series circuit 33 as seen from the output end of the carrier amplifier 11 or 12 to the output end side of the peak amplifier 13. The bandpass characteristics of the LC series circuit 34, as seen from the output end of the carrier amplifier 11 or 12 to the output end side of the peak amplifier 14, and the combined bandpass characteristics of the LC series circuits 33 and 34, as seen from the output end of the carrier amplifier 11 or 12 to the output end side of the peak amplifiers 13 and 14, are similar to the bandpass characteristics of the LC series circuit 33 illustrated in FIG. 5. In FIG. 4A, the circuit configuration upstream of the terminals 110 to 140 is not illustrated.

For example, in the LC series circuit 33, the inductance value of the inductor 331 and the capacitance value of the capacitor 332 are set so that the LC series resonant frequency matches the second harmonic of signals which are output from the peak amplifier 13. In the LC series circuits 31, 32 and 34, the inductance values and the capacitance values are set similarly.

Thus, in the amplifier circuit 10, based on the carrier amplifiers 11 and 12 and the peak amplifiers 13 and 14 operating (are ON) (in the case of reception of a large signal), the second harmonics generated by the respective amplifiers may be suppressed (the thin dashed line in FIG. 5).

Based on the carrier amplifiers 11 and 12 operating (are ON) and the peak amplifiers 13 and 14 not operating (are OFF) (in the case of reception of a small signal), the state in which the LC series resonant frequencies defined by the LC series circuits 33 and 34 and the capacitor 40 match the fundamental-wave frequency of signals which are output from the amplifiers may be avoided (the solid line in FIG. 5).

The left part in FIG. 4B illustrates the case where the peak amplifier 13 is operating (is ON). For the signal path connecting the terminal 130 to the transformer 22, the LC series circuit 33 is operating in resonance at the LC series resonant frequency defined by the inductor 331 and the capacitor 332. In contrast, the right part in FIG. 4B illustrates the case where the peak amplifier 13 does not operate (is OFF). Since no signals flow through the path connecting the terminal 130 to the peak amplifier 13, the LC series circuit 33 operates in resonance at the LC series resonant frequency, which is defined by the inductor 331, the capacitor 332, and the capacitor 40 disposed on the path connecting the peak amplifier 13 to the signal output terminal 200. Therefore, the LC series resonant frequency, which is defined by the LC series circuit 33 and the capacitor 40, is shifted to the higher frequency side than the LC series resonant frequency of the equivalent circuit, which is illustrated in the right side in FIG. 3B, due to addition of the capacitor 40. This enables avoidance of suppression of the fundamental wave which is output from the carrier amplifiers 11 and 12 (the solid line in FIG. 5).

In contrast, in the amplifier circuit 600 according to the comparison example, based on the carrier amplifiers 11 and 12 operating (are ON) and the peak amplifiers 13 and 14 not operating (are OFF) (in the case of reception of a small signal), the LC series resonant frequency, which is defined by the LC series circuit 33, is shifted to the low frequency side by the additional parasitic inductance. This causes a concern that the fundamental wave on the low frequency side is suppressed (the coarse dashed line in FIG. 5).

The amplifier circuit 10 according to the present embodiment allows omission of the quarter-wavelength transmission lines 93 and 94 included in the amplifier circuits 500 and 600. The quarter-wavelength transmission lines 93 and 94 have a function of shifting the phases of signals which are output from the peak amplifiers 13 and 14. In contrast, in the amplifier circuit 10, the capacitor 40 may shift the phases of signals which are output from the peak amplifiers 13 and 14. That is, the capacitor 40 may replace at least some of the functions of the quarter-wavelength transmission lines 93 and 94.

[1.6 the Capacitance Value of the Capacitor 40 According to the Embodiment]

Figure 6:
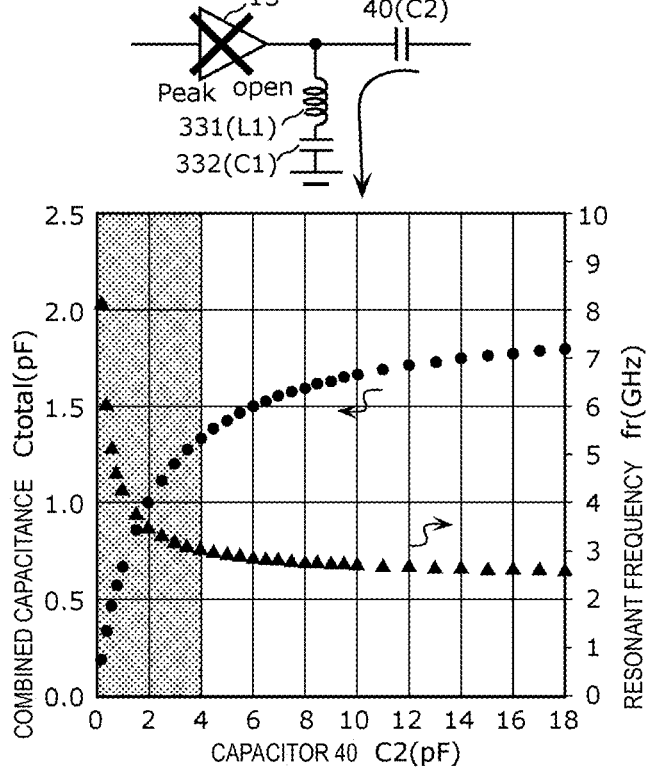
FIG. 6 is a graph of the relationship, between a first capacitive device, a second capacitive device, and resonant frequency, of an equivalent circuit including an LC series circuit.

The capacitance value of the capacitor 40, which does not degrade the transmission characteristics of the fundamental wave while a harmonic of the amplifier circuit 10 is suppressed, will be described. FIG. 6 includes a diagram illustrating the equivalent circuit, including the LC series circuit 33, and a graph of an exemplary relationship between the capacitor 40, combined capacitance, and resonant frequency.

As illustrated in the upper part in FIG. 6, the capacitance value of the capacitor 332 is represented by C1 in the LC series circuit 33; the inductance value of the inductor 331 is represented by L1; the capacitance value of the capacitor 40 is represented by C2. At that time, the combined capacitance value Ctotal of the capacitor 332 and the capacitor 40 is $\{(C1\times C2)/(C1+C2)\}$; the resonant frequency fr of the equivalent circuit including the LC series circuit 33 is $\{1/(2\pi\Pi(L\times Ctotal))\}$.

For example, the LC series resonant frequency f0 where C1=2.0 pF, L=2.0 nH (including L1 and the parasitic inductance around the inductor 331) is 2.5 GHz. It is assumed that the resonant frequency f0 matches the frequency of the fundamental wave. In contrast, based on C2 being greater than 4 pF (C2>2×C1), as illustrated in FIG. 6, the resonant frequency fr is between 2.5 GHz and 3 GHz, which is close to the resonant frequency f0. In contrast, based on C2 being less than or equal to 4 pF (C2≤2×C1), as illustrated in FIG. 6, the resonant frequency fr is greater than or equal to 3 GHz, which deviates to the higher frequency side than the resonant frequency f0 (fundamental-wave frequency). Therefore, the capacitance value C2 of the capacitor 40 is desirably less than or equal to twice the capacitance value C1 of the capacitor 322.

The viewpoint described above suggests that the capacitance value C2 of the capacitor 40 is desirably smaller as much as possible. However, a smaller capacitance value C2 causes a smaller shift amount of the phase of signals which are output from the peak amplifier 13. This makes it difficult to replace the quarter-wavelength transmission line 93 with the capacitor 40.

[1.7 the Configurations of Radio Frequency Circuits According to First to Fifth Modified Examples]

The circuit configurations of modified examples of the radio frequency circuit 1 will be described.

Figure 7:
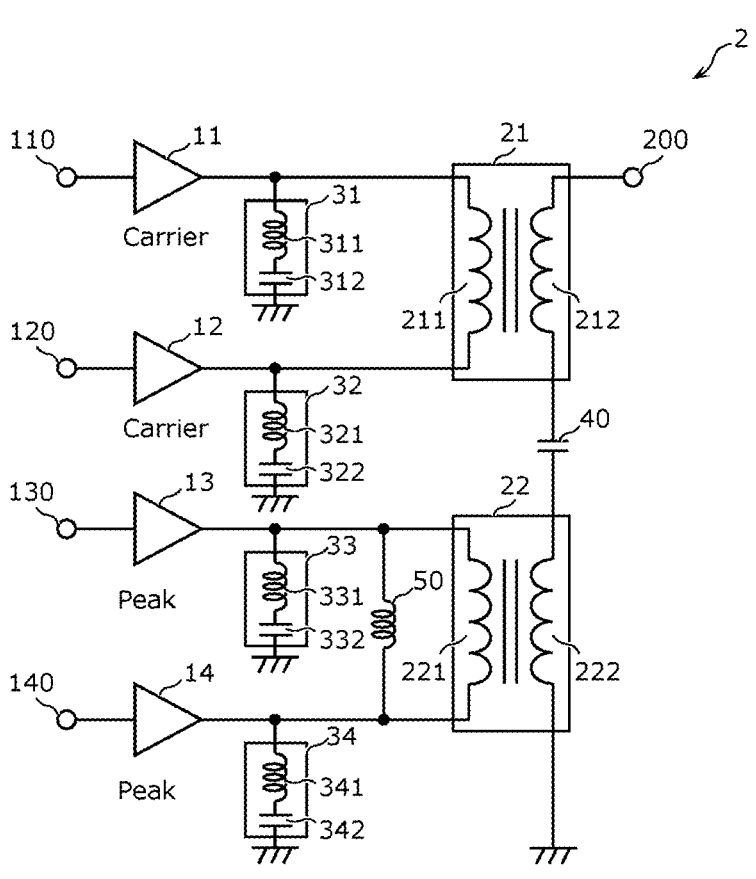
FIG. 7 is a diagram illustrating the circuit configuration of a radio frequency circuit according to a first modified example of the embodiment.

FIG. 7 is a diagram illustrating the circuit configuration of a radio frequency circuit 2 according to a first modified example of the embodiment. FIG. 7 illustrates only a part of the radio frequency circuit 2, which is different from that of the radio frequency circuit 1. The radio frequency circuit 2 according to the first modified example is different from the radio frequency circuit 1 according to the embodiment in the part corresponding to the amplifier circuit. The radio frequency circuit 2 according to the present modified example will be described below by skipping description about the same configuration as that of the radio frequency circuit 1 according to the embodiment and by focusing on different configurations.

Compared with the radio frequency circuit 1, the radio frequency circuit 2 further includes an inductor 50. The inductor 50, which is an exemplary first inductor, is connected to the output terminal of the peak amplifier 13 and the output terminal of the peak amplifier 14, and is connected in parallel to the input-side coil 221.

Figure 8:
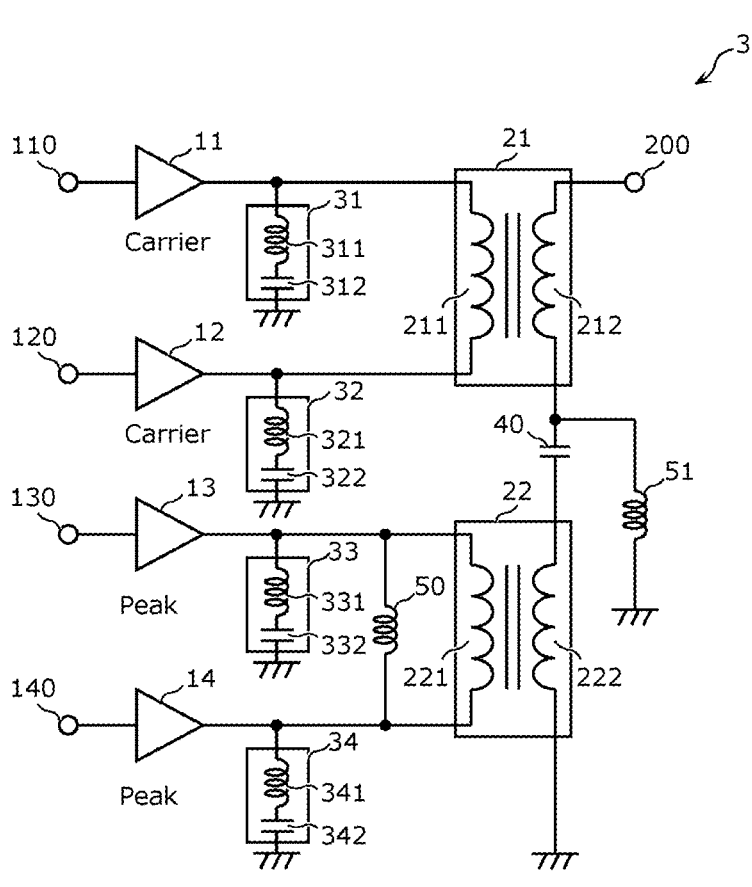
FIG. 8 is a diagram illustrating the circuit configuration of a radio frequency circuit according to a second modified example of the embodiment.

FIG. 8 is a diagram illustrating the circuit configuration of a radio frequency circuit 3 according to a second modified example of the embodiment. FIG. 8 illustrates only a part of the radio frequency circuit 3, which is different from that of the radio frequency circuit 1. The radio frequency circuit 3 according to the second modified example is different from the radio frequency circuit 1 according to the embodiment only in the part corresponding to the amplifier circuit. The radio frequency circuit 3 according to the present modified example will be described below by skipping description about the same configuration as that of the radio frequency circuit 2 according to the first modified example and by focusing on different configurations.

Compared with the radio frequency circuit 2, the radio frequency circuit 3 further includes an inductor 51. The inductor 51 is connected between the ground and the connection point between the capacitor 40 and the second end of the output-side coil 212.

Figure 9:
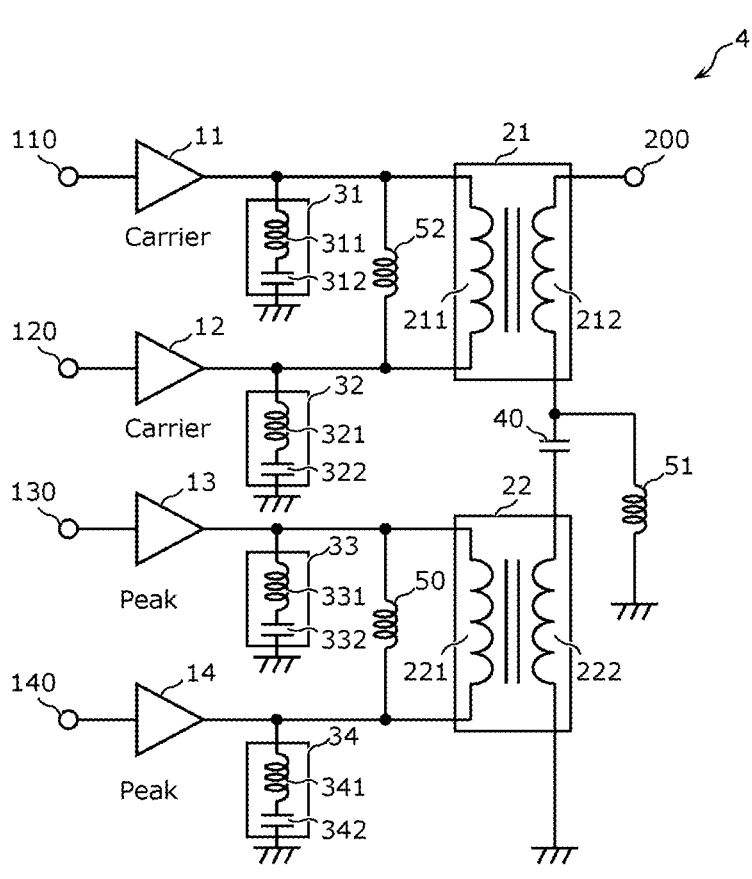
FIG. 9 is a diagram illustrating the circuit configuration of a radio frequency circuit according to a third modified example of the embodiment.

FIG. 9 is a diagram illustrating the circuit configuration of a radio frequency circuit 4 according to a third modified example of the embodiment. FIG. 9 illustrates only a part of the radio frequency circuit 4, which is different from that of the radio frequency circuit 1. The radio frequency circuit 4 according to the third modified example is different from the radio frequency circuit 1 according to the embodiment only in the part corresponding to the amplifier circuit. The radio frequency circuit 4 according to the present modified example will be described below by skipping description about the same configuration as that of the radio frequency circuit 3 according to the second modified example and by focusing on different configurations.

Compared with the radio frequency circuit 3, the radio frequency circuit 4 further includes an inductor 52. The inductor 52, which is an exemplary third inductor, is connected to the output terminal of the carrier amplifier 11 and the output terminal of the carrier amplifier 12, and is connected in parallel to the input-side coil 211.

Figure 10:
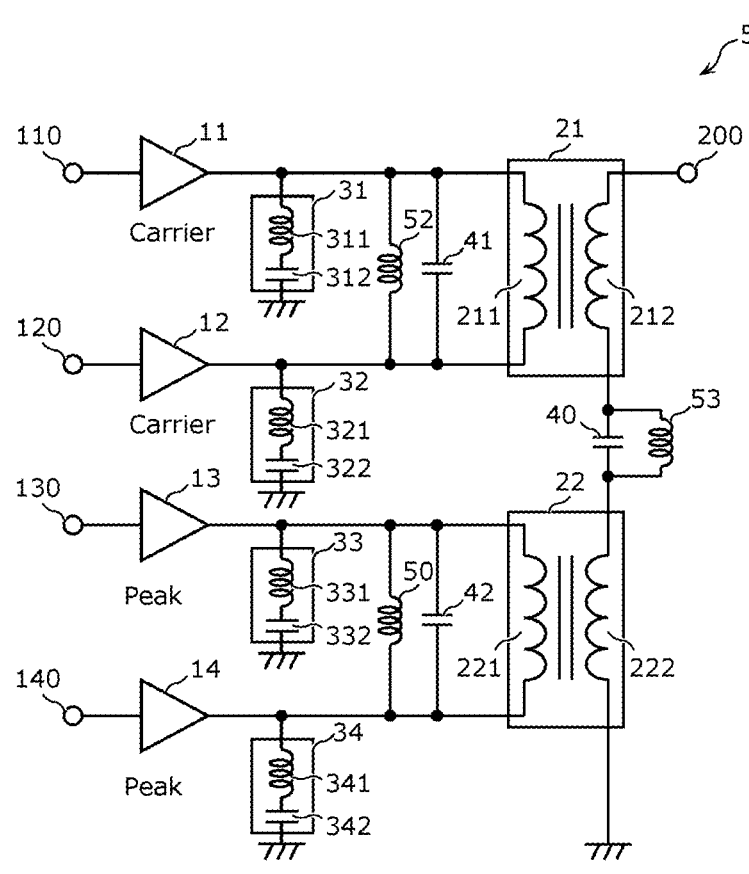
FIG. 10 is a diagram illustrating the circuit configuration of a radio frequency circuit according to a fourth modified example of the embodiment.

FIG. 10 is a diagram illustrating the circuit configuration of a radio frequency circuit 5 according to a fourth modified example of the embodiment. FIG. 10 illustrates only a part of the radio frequency circuit 5, which is different from that of the radio frequency circuit 1. The radio frequency circuit 5 according to the fourth modified example is different from the radio frequency circuit 1 according to the embodiment only in the part corresponding to the amplifier circuit. The radio frequency circuit 5 according to the present modified example will be described below by skipping description about the same configuration as that of the radio frequency circuit 1 according to the embodiment and by focusing on different configurations.

Compared with the radio frequency circuit 1, the radio frequency circuit 5 further includes inductors 50, 52 and 53 and capacitors 41 and 42. The inductor 50, which is an exemplary first inductor, is connected to the output terminal of the peak amplifier 13 and the output terminal of the peak amplifier 14, and is connected in parallel to the input-side coil 221. The capacitor 42 is connected to the output terminal of the peak amplifier 13 and the output terminal of the peak amplifier 14, and is connected in parallel to the input-side coil 221 and the inductor 50. The inductor 52, which is an exemplary third inductor, is connected to the output terminal of the carrier amplifier 11 and the output terminal of the carrier amplifier 12, and is connected in parallel to the input-side coil 211. The capacitor 41 is connected to the output terminal of the carrier amplifier 11 and the output terminal of the carrier amplifier 12, and is connected in parallel to the input-side coil 211 and the inductor 52. The inductor 53 is connected in parallel to the capacitor 40.

[1.8 The Component Layout Configuration of the Radio Frequency Circuit 2]

The component mounting configuration of the radio frequency circuit 2 according to the first modified example will be described.

Figure 11:
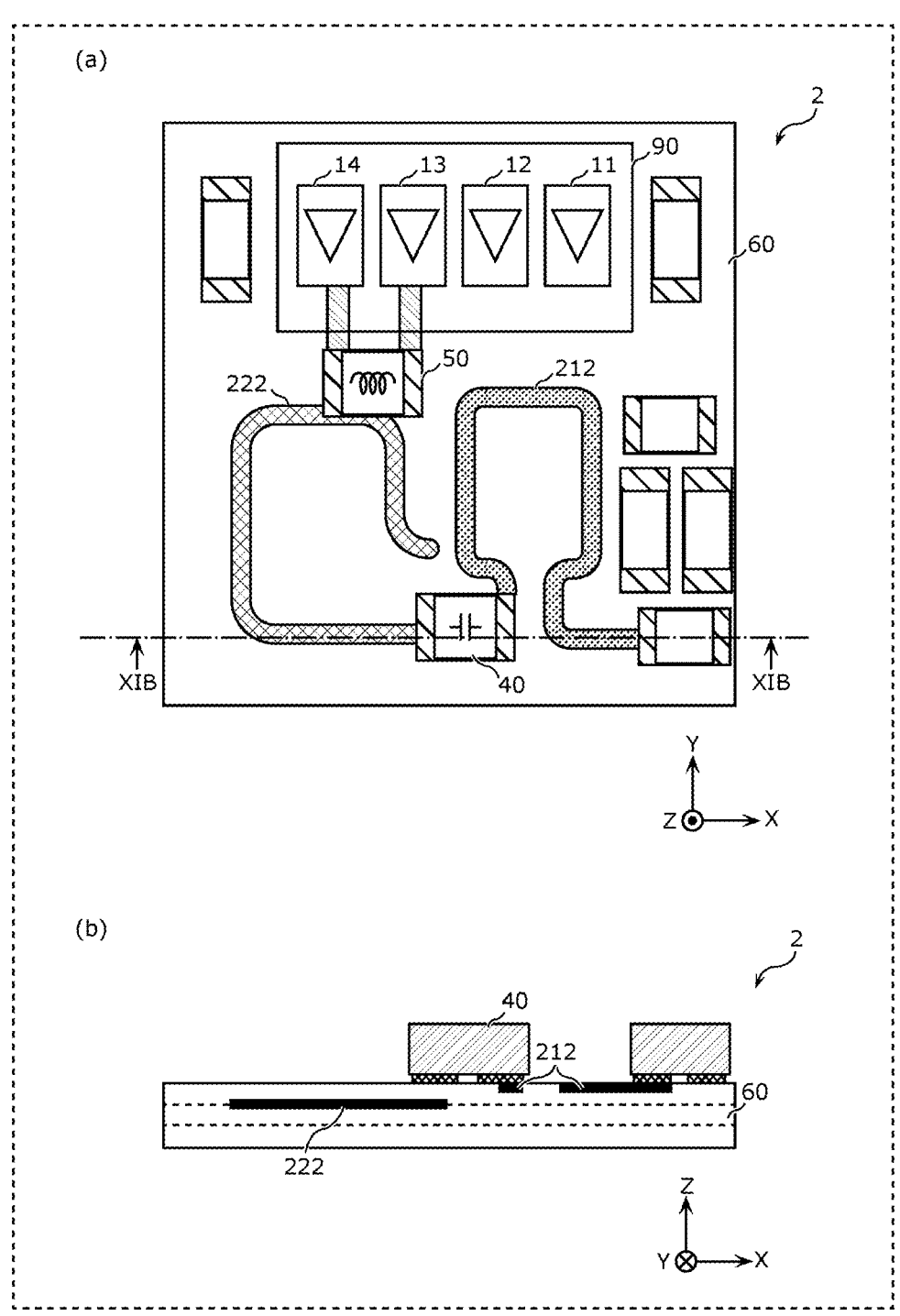
FIG. 11 includes a plan view and a cross-sectional view of a radio frequency circuit according to the first modified example of the embodiment.

FIG. 11 includes a plan view and a cross-sectional view of the radio frequency circuit 2 according to the first modified example of the embodiment. FIG. 11(a) is a perspective view of the layout of circuit components when a principal surface of a substrate 60 is viewed from the z-axis positive direction side. FIG. 11(b) is a cross-sectional view along line XIB-XIB in FIG. 11(a). In FIG. 11(a), to easily understand the layout relationship of the circuit components, marks representing functions may be added to the circuit components. However, the marks are not added to the actual circuit components. In FIG. 11, wiring for connection of the substrate 60 and the circuit components is not illustrated.

The radio frequency circuit 2 may further include a resin member, which covers a surface of the substrate 60 and some of the circuit components, and a shield electrode layer, which covers surfaces of the resin member. FIG. 11 does not illustrate the resin member and the shield electrode layer.

The radio frequency circuit 2 further includes the substrate 60 in addition to the circuit configuration illustrated in FIG. 7.

The substrate 60 is a substrate including circuit components included in the radio frequency circuit 2. Examples of the substrate 60 include a low temperature co-fired ceramics (LTCC) substrate, a high temperature co-fired ceramics (HTCC) substrate, a component-embedded substrate, a substrate having a redistribution layer (RDL), and a printed board, which have a layered structure of multiple dielectric layers.

A semiconductor IC 90, the capacitor 40, and the inductor 50 are disposed on the surface of the substrate 60.

The semiconductor IC 90 includes the carrier amplifiers 11 and 12 and the peak amplifiers 13 and 14. The semiconductor IC 90 is formed, for example, by using CMOS (Complementary Metal Oxide Semiconductor), and may be specifically manufactured through a SOI (Silicon on Insulator) process. The semiconductor IC 90 may be formed of at least one of the following materials: GaAs; SiGe; or GaN. The semiconductor material of the semiconductor IC 90 is not limited to the materials described above. The LC series circuits 31 to 34 may be included in the semiconductor IC 90.

The capacitor 40 is a surface mount device, and is disposed on the surface of the substrate 60.

The transformers 21 and 22 are formed on the surface of the substrate 60 or inside the substrate 60. The output-side coils 212 and 222 include planar conductors formed on the surface of the substrate 60 or inside the substrate 60. The output-side coil 212 and the output-side coil 222 may be formed in the same layer of the substrate 60, or may be formed in different layers. Each of the output-side coils 212 and 222 may be formed across multiple layers. The input-side coils 211 and 221 also include planar conductors formed on the surface of the substrate 60 or inside the substrate 60 (not illustrated). In plan view of the substrate 60, the input-side coil 211 overlaps the output-side coil 212 at least partially; the input-side coil 221 overlaps the output-side coil 222 at least partially.

As illustrated in FIG. 11, in plan view of the substrate 60, the capacitor 40 may overlap the output-side coil 212; and the capacitor 40 may overlap the output-side coil 222.

The other circuit components, which are included in the radio frequency circuit 2, that is, the filters 82 and 83, the switches 81 and 84, the input terminal 101, the antenna connection terminal 102, the preamplifier 15, the phase-shift circuit 70, the transformers 21 and 22, the LC series circuits 31 to 34, and the signal output terminal 200, may be formed on the surface of the substrate 60 or inside the substrate 60, or may be formed somewhere other than the substrate 60.

The capacitor 40 may include a planar conductor formed inside the substrate 60.

The radio frequency circuits 3, 4 and 5 may have configurations similar to the component layout configuration illustrated in FIG. 11. The radio frequency circuit 1 may have a configuration in which the inductor 50 in the component layout configuration illustrated in FIG. 11 is not disposed.

[1.9 the Configuration of a Radio Frequency Circuit According to a Sixth Modified Example]

Figure 13:
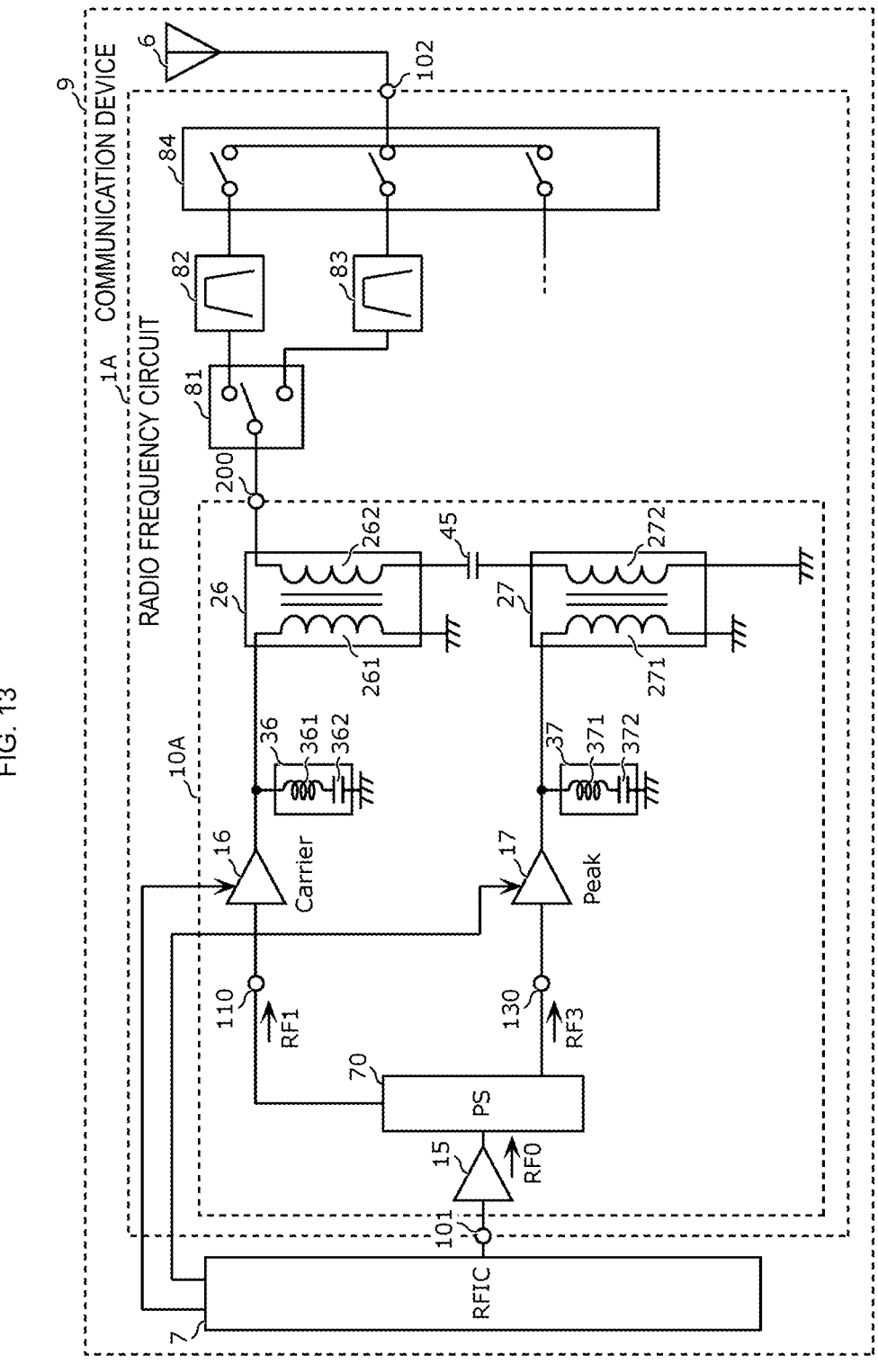
FIG. 13 is a diagram illustrating the circuit configuration of a radio frequency circuit and a communication device according to a sixth modified example of the embodiment.

The circuit configuration of a radio frequency circuit 1A and a communication device 9 according to a sixth modified example of the present embodiment will be described by referring to FIG. 13. FIG. 13 is a diagram illustrating the circuit configuration of the radio frequency circuit 1A and the communication device 9 according to the sixth modified example of the embodiment. As illustrated in FIG. 13, the communication device 9 according to the present modified example includes the radio frequency circuit 1A, the antenna 6, and the RFIC 7. The communication device 9 according to the present modified example is different from the communication device 8 according to the embodiment only in the configuration of an amplifier circuit 10A included in the radio frequency circuit 1A. Thus, the configuration of the amplifier circuit 10A will be mainly described below. As illustrated in FIG. 13, the radio frequency circuit 1A includes the amplifier circuit 10A, the filters 82 and 83, the switches 81 and 84, the input terminal 101, and the antenna connection terminal 102.

The amplifier circuit 10A is a Doherty amplifier circuit which amplifies signals in Band A and Band B which are received from the input terminal 101. The radio frequency circuit 1A may include, instead of the amplifier circuit 10A, a first Doherty amplifier circuit which amplifies radio frequency signals in Band A and a second Doherty amplifier circuit which amplifies radio frequency signals in Band B.

As illustrated in FIG. 13, the amplifier circuit 10A includes a carrier amplifier 16, a peak amplifier 17, the preamplifier 15, the phase-shift circuit 70, transformers 26 and 27, LC series circuits 36 and 37, a capacitor 45, and the signal output terminal 200. The amplifier circuit 10A according to the present modified example is different from the amplifier circuit 10 according to the embodiment in that each of the carrier amplifier and the peak amplifier does not serve as a differential amplifier, and is constituted by a single amplifier. The amplifier circuit 10A according to the present modified example will be described below by skipping description about the same configuration as that of the amplifier circuit 10 according to the embodiment and by focusing on different configurations.

The phase-shift circuit 70 distributes the signal RF0, which is output from the preamplifier 15, and outputs the distributed signals RF1 and RF3 through the terminals 110 and 130 to the carrier amplifier 16 and the peak amplifier 17, respectively. At that time, the phase-shift circuit 70 adjusts the phases of the signals RF1 and RF3. For example, the phase-shift circuit 70 shifts the signal RF1 by +90° relative to RF0 (90° advance), and shifts the signal RF3 by 0° relative to RF0 (no shift).

The configuration of the preamplifier 15 and the phase-shift circuit 70 is not limited to the configuration described above. For example, preamplifiers 15 may be disposed before the carrier amplifier 16 and the peak amplifier 17, respectively. In this case, phase-shift circuits 70 may be disposed before the respective preamplifiers or before the carrier amplifier 16 and the peak amplifier 17, respectively. The amplifier circuit 10A does not necessarily include the preamplifier 15 and the phase-shift circuit 70.

Each of the carrier amplifier 16 and the peak amplifier 17 has an amplifier transistor. The amplifier transistor is, for example, a bipolar transistor such as an HBT or a field-effect transistor such as a MOSFET.

The carrier amplifier 16, which is an exemplary first amplifying device in the present modified example, is a class A (or class AB) amplifier circuit operable to amplify all power levels of the signal RF1. In particular, the carrier amplifier 16 is operable to perform highly efficient amplification in the low output range and the medium output range. The first amplifying device according to the present modified example may have any configuration as long as it is a class A (or class AB) amplifier circuit, and is not limited to a carrier amplifier.

The peak amplifier 17, which is an exemplary second amplifying device according to the present modified example, is, for example, a class C amplifier circuit operable to perform amplification in a range in which the power level of the signal RF3 is high. A bias voltage lower than that applied to the amplifier transistor included in the carrier amplifier 16 is applied to the amplifier transistor included in the peak amplifier 17. Thus, as the power level of the signal RF3 increases, the output impedance decreases. This enables the peak amplifier 17 to be operable to perform amplification with low distortion in the high output range. The second amplifying device according to the present modified example may have any configuration as long as it is a class C amplifier circuit, and is not limited to a peak amplifier.

The transformer 26, which is an exemplary first transformer, has an input-side coil 261 (first input-side coil) and an output-side coil 262 (first output-side coil). The input-side coil 261 is connected, at its first end, to the output terminal of the carrier amplifier 16, and is connected, at its second end, to the ground. The output-side coil 262 is connected, at its first end, to the signal output terminal 200, and is connected, at its second end, to a first end of the capacitor 45.

The transformer 27, which is an exemplary second transformer, has an input-side coil 271 (second input-side coil) and an output-side coil 272 (second output-side coil). The input-side coil 271 is connected, at its first end, to the output terminal of the peak amplifier 17, and is connected, at its second end, to the ground. The output-side coil 272 is connected, at its first end, to a second end of the capacitor 45, and is connected, at its second end, to the ground.

According to the connection configuration of the transformers 26 and 27, the voltage of a signal, which is output from the carrier amplifier 16, and that of a signal, which is output from the peak amplifier 17, are added together, and the combined output signal is output from the signal output terminal 200.

The LC series circuit 36, which is an exemplary first LC series circuit according to the present modified example, has an inductor 361 and a capacitor 362 which are connected in series to each other, and is connected between the output terminal of the carrier amplifier 16 and the ground. In the present embodiment, the capacitor 362 is connected to the ground side. Alternatively, the inductor 361 may be connected to the ground side.

The LC series circuit 37, which is an exemplary second LC series circuit according to the present modified example, has an inductor 371 (first inductor according the present modified example) and a capacitor 372 (second capacitive device according to present modified example) which are connected in series to each other, and is connected between the output terminal of the peak amplifier 17 and the ground. In the present embodiment, the capacitor 372 is connected to the ground side. Alternatively, the inductor 371 may be connected to the ground side.

The inductors 361 and 371 may be chip components and planar conductors formed in/on a substrate, or may be formed of wiring such as wires.

The amplifier circuit and the radio frequency circuit according to the present modified example do not necessarily include the LC series circuit 36, and may have any configuration as long as they include the LC series circuit 37.

The capacitor 45, which is an exemplary first capacitive device, is connected, at its first end (one of the electrodes), to the second end of the output-side coil 262, and is connected, at its second end (the other electrode), to the first end of the output-side coil 272. The capacitor 45 may be a chip capacitor, or may include a planar conductor formed inside a substrate.

Figure 14A:
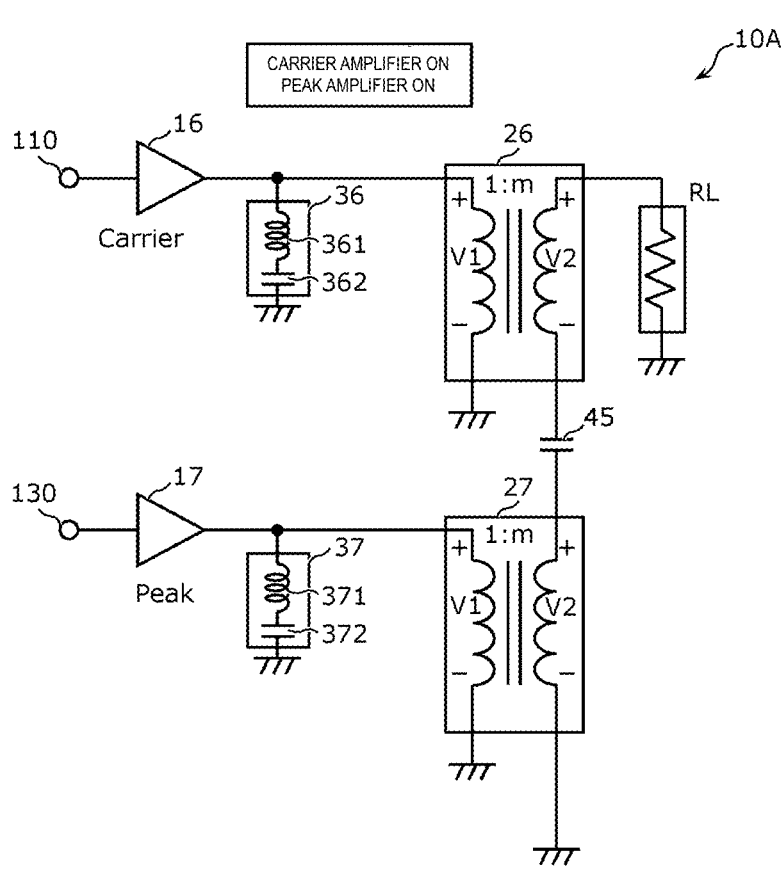
FIG. 14A is a diagram illustrating the circuit state of an amplifier circuit according to the sixth modified example of the embodiment in the case of reception of a large signal.

FIG. 14A is a diagram illustrating the circuit state of the amplifier circuit 10A according to the sixth modified example of the embodiment in the case of reception of a large signal. As illustrated in FIG. 14A, based on the amplifier circuit 10A receiving a large signal, the carrier amplifier 16 and the peak amplifier 17 are operating (are ON).

Figure 14B:
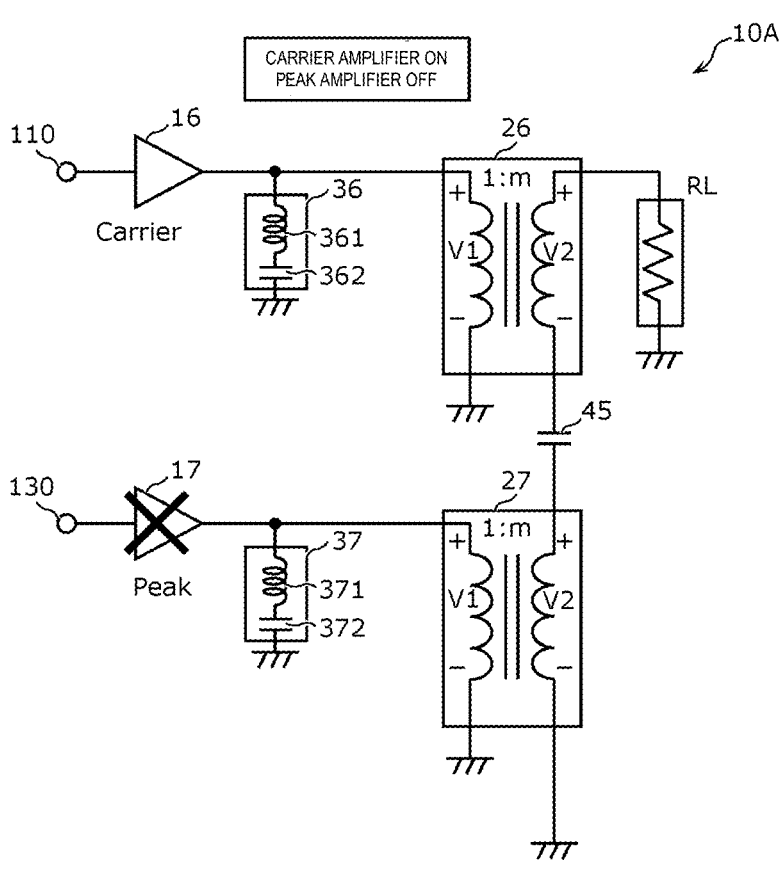
FIG. 14B is a diagram illustrating the circuit state of an amplifier circuit according to the sixth modified example of the embodiment in the case of reception of a small signal.

FIG. 14B is a diagram illustrating the circuit state of the amplifier circuit 10A according to the sixth modified example of the embodiment in the case of reception of a small signal. As illustrated in FIG. 14B, based on the amplifier circuit 10A receiving a small signal, the carrier amplifier 16 operates (is ON), and the peak amplifier 17 does not operate (is OFF).

Compared with the case of reception of a large signal, the output impedance of the carrier amplifier 16 is high in the case of reception of a small signal. That is, in the case of reception of a small signal, the peak amplifier 17 is off, and the output impedance of the carrier amplifier 16 is high, enabling the amplifier circuit 10A to operate with high efficiency.

In contrast, in the case of reception of a large signal, the carrier amplifier 16 and the peak amplifier 17 operate, achieving output of a large power signal. In addition, the output impedance of the peak amplifier 17 is low, enabling the signal distortion to be suppressed.

As illustrated in FIGS. 13, 14A, and 14B, the amplifier circuit 10A additionally has the LC series circuits 36 and 37 for suppressing the second harmonics. The LC series circuits 36 and 37 are circuits for terminating the second harmonics of signals which are output from the amplifiers. For example, in the LC series circuit 37, the inductance value of the inductor 371 and the capacitance value of the capacitor 372 are set so that the LC series resonant frequency matches the second harmonic of signals which are output from the peak amplifier 17. In the LC series circuit 36, the inductance value and the capacitance value are set similarly.

Thus, based on the carrier amplifier 16 and the peak amplifier 17 operating (are ON) (in the case of reception of a large signal), the amplifier circuit 10A enables suppression of the second harmonics generated by the amplifiers.

However, based on the carrier amplifier 16 operating (is ON) and the peak amplifier 17 not operating (is OFF) (in the case of reception of a small signal), the LC series resonant frequency defined by the LC series circuits 36 and 37 is shifted by a large extent from the frequency of the second harmonic.

Based on the peak amplifier 17 operating (is ON), for the signal path connecting the terminal 130 to the transformer 27, the LC series circuit 37 is operating in resonance at the LC series resonant frequency, which is defined by the inductor 371 and the capacitor 372. Based on the peak amplifier 17 not operating (is OFF), since no signals flow through the path connecting the terminal 130 to the peak amplifier 17, the LC series circuit 37 operates in resonance at the LC series resonant frequency defined by the inductor 371, the capacitor 372, and the parasitic inductance of the path connecting the peak amplifier 17 to the signal output terminal 200. Therefore, the LC series resonant frequency defined by the LC series circuit 37 is shifted to the low frequency side by the additional parasitic inductance. This causes a concern that the second harmonic generated by the carrier amplifier 16 is not suppressed and that the fundamental wave on the lower frequency side is suppressed.

In contrast, in the amplifier circuit 10A according to the present modified example, the capacitor 45 is connected between the second end of the output-side coil 262 and the first end of the output-side coil 272. Based on the carrier amplifier 16 operating (is ON) and the peak amplifier 17 not operating (is OFF) (in the case of reception of a small signal), the state in which the LC series resonant frequency defined by the LC series circuit 37 and the capacitor 45 matches the fundamental-wave frequency of signals, which are output from the amplifiers, may be avoided.

More specifically, based on the peak amplifier 17 operating (is ON), for the signal path connecting the terminal 130 to the transformer 27, the LC series circuit 37 is operating in resonance at the LC series resonant frequency defined by the inductor 371 and the capacitor 372. In contrast, based on the peak amplifier 17 not operating (is OFF), since no signals flow through the path connecting the terminal 130 to the peak amplifier 17, the LC series circuit 37 operates in resonance at the LC series resonant frequency defined by the inductor 371, the capacitor 372, and the capacitor 45 disposed on the path connecting the peak amplifier 17 to the signal output terminal 200. Therefore, due to addition of the capacitor 45, the LC series resonant frequency defined by the LC series circuit 37 and the capacitor 45 is shifted to the higher frequency side than the LC series resonant frequency defined by the inductor 371, the capacitor 372, and the parasitic inductance of the path connecting the peak amplifier 17 to the signal output terminal 200. Therefore, suppression of the fundamental wave which is output from the carrier amplifier 16 may be avoided.

The amplifier circuit 10A according to the present modified example allows omission of a quarter-wavelength transmission line disposed between the output terminal of the peak amplifier 17 and the first end of the input-side coil 271. A quarter-wavelength transmission line has a function of shifting the phase of signals which are output from the peak amplifier 17. In the amplifier circuit 10A, the capacitor 45 is capable of shifting the phase of signals which are output from the peak amplifier 17. That is, the capacitor 45 may replace at least some of the functions of a quarter-wavelength transmission line.

In the LC series circuit 37, the capacitance value of the capacitor 372 is represented by C1; the inductance value of the inductor 371 is represented by L1; the capacitance value of the capacitor 45 is represented by C2. At that time, the combined capacitance value Ctotal of the capacitor 372 and the capacitor 45 is $\{(C1{\times}C2)/(C1{+}C2)\}$; the resonant frequency fr of the equivalent circuit including the LC series circuit 37 is $\{1/(2\pi\sqrt{(L{\times}Ctotal)})\}$.

The LC series resonant frequency f0 in the case where C1=2.0 pF, L=2.0 nH (including L1 and the parasitic inductance around the inductor 371) is 2.5 GHz. It is assumed that the resonant frequency f0 matches the frequency of the fundamental wave. In contrast, based on C2 being greater than 4 pF (C2>2×C1), the resonant frequency fr is between 2.5 GHz and 3 GHz, which is close to the resonant frequency f0 (see FIG. 6). In contrast, based on C2 being less than or equal to 4 pF (C2≤2×C1), the resonant frequency fr is higher than or equal to 3 GHz, which deviates to the higher frequency side than the resonant frequency f0 (fundamental-wave frequency). Therefore, the capacitance value C2 of the capacitor 45 is desirably less than or equal to twice the capacitance value C1 of the capacitor 372.

The viewpoint described above suggests that the capacitance value C2 of the capacitor 45 is desirably smaller as much as possible. However, a smaller capacitance value C2 causes a smaller shift amount of the phase of signals which are output from the peak amplifier 17. This makes it difficult to replace a quarter-wavelength transmission line with the capacitor 45.

Like the radio frequency circuit 2 according to the first modified example, the radio frequency circuit 1A according to the present modified example may have a configuration in which the circuit components are disposed on/in the substrate 60. That is, the radio frequency circuit 1A according to the sixth modified example may further include the substrate 60. The capacitor 45 may be a surface mount device disposed on the surface of the substrate 60. The output-side coils 262 and 272 may include planar conductors formed on the surface of the substrate 60 or inside the substrate 60. In plan view of the substrate 60, the capacitor 45 may overlap the output-side coil 262; the capacitor 45 may overlap the output-side coil 272.

According to this, wiring which connects the output-side coils 262 and 272 to the capacitor 45 may be made short, achieving highly accurate signal transmission characteristics of the radio frequency circuit 1A and a reduction in size of the radio frequency circuit 1A.

[1.10 the Configuration of a Radio Frequency Circuit According to a Seventh Modified Example]

Figure 15:
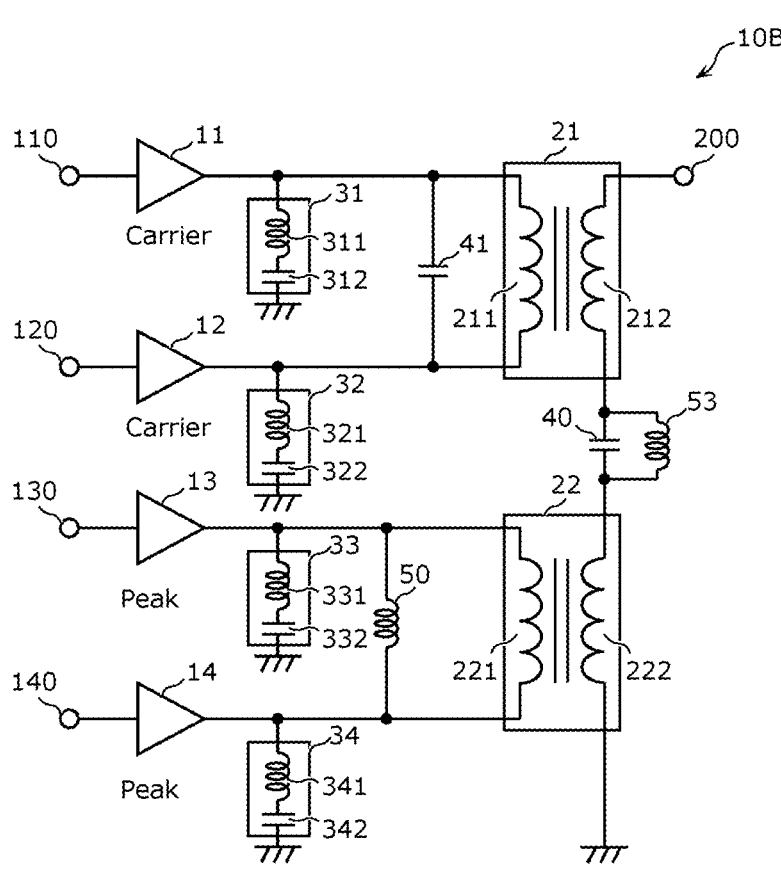
FIG. 15 is a diagram illustrating the circuit configuration of an amplifier circuit according to a seventh modified example of the embodiment.

FIG. 15 is a diagram illustrating the circuit configuration of an amplifier circuit 10B according to a seventh modified example of the embodiment. FIG. 15 illustrates only the amplifier circuit 10B, which is a part different from that of the radio frequency circuit 1, of a radio frequency circuit according to the seventh modified example. The radio frequency circuit according to the seventh modified example is different from the radio frequency circuit 1 according to the embodiment only in the part corresponding to the amplifier circuit 10B. The radio frequency circuit according to the present modified example will be described below by skipping description about the same configuration as that of the radio frequency circuit 5 according to the fourth modified example and by focusing on different configurations.

Compared with the radio frequency circuit 5, the radio frequency circuit according to the present modified example includes neither the inductor 52 nor the capacitor 42.

The inductor 50, which is an exemplary first inductor, is connected to the output terminal of the peak amplifier 13 and the output terminal of the peak amplifier 14, and is connected in parallel to the input-side coil 221. The capacitor 41, which is an exemplary third capacitive device, is connected to the output terminal of the carrier amplifier 11 and the output terminal of the carrier amplifier 12, and is connected in parallel to the input-side coil 211.

Figure 16A:
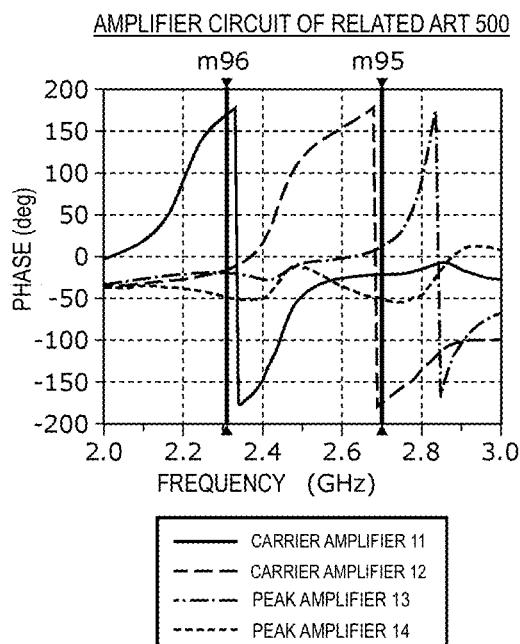
FIG. 16A is a graph of the phases of output signals of the amplifiers of a Doherty amplifier circuit of the related art.
Figure 16B:
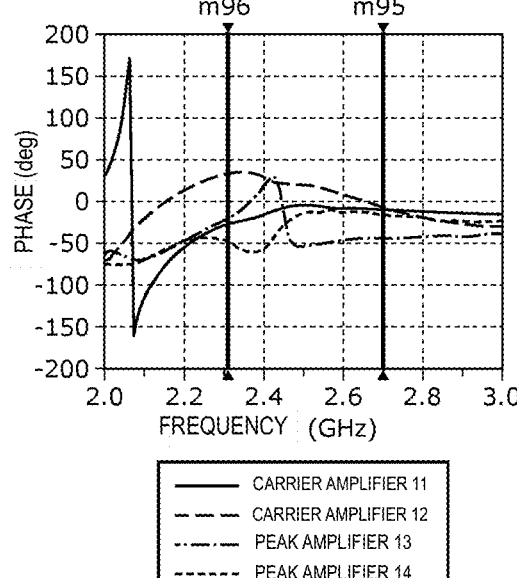
FIG. 16B is a graph of the phases of output signals of the amplifiers of an amplifier circuit according to the seventh modified example of the embodiment.

FIG. 16A is a graph of the phases of output signals from the amplifiers of the Doherty amplifier circuit 500 of the related art. FIG. 16B is a graph of the phases of output signals of the amplifiers of the amplifier circuit 10B according to the seventh modified example of the embodiment.

In the amplifier circuit 500 of the related art, the differences between the phases of the carrier amplifiers 11 and 12 and the phases of the peak amplifiers 13 and 14 are large, whereas, in the amplifier circuit 10B according to the present modified example, the differences between the phases of the carrier amplifiers 11 and 12 and the phases of the peak amplifiers 13 and 14 are reduced. That is, the capacitor 41 adjusts the phases of output signals from the carrier amplifiers 11 and 12, and the inductor 50 adjusts the phases of output signals from the peak amplifiers 13 and 14. Thus, the phase differences between the carrier amplifiers 11 and 12 and the peak amplifiers 13 and 14 may be reduced.

Figure 17A:
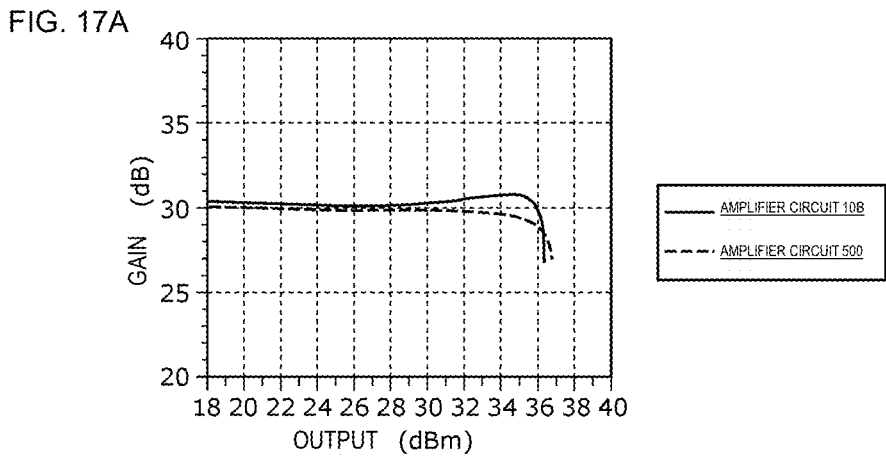
FIG. 17A is a graph of the relationships, between gain and output power, of an amplifier circuit according to the seventh modified example and an amplifier circuit of the related art.

FIG. 17A is a graph of the relationships, between an output power and a gain, of the amplifier circuit 10B according to the seventh modified example and the amplifier circuit 500 of the related art. In the amplifier circuit 10B according to the seventh modified example, degradation of gain is suppressed in the high output range.

Figure 17B:
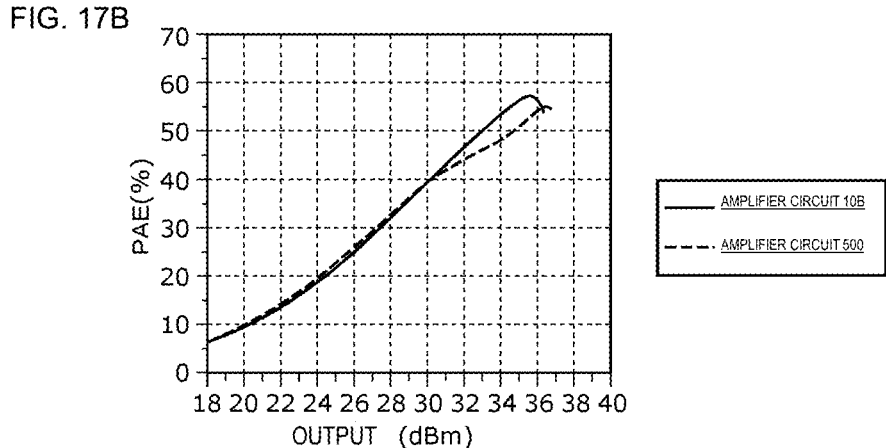
FIG. 17B is a graph of the relationships, between output power and efficiency, of an amplifier circuit according to the seventh modified example and an amplifier circuit of the related art.

FIG. 17B is a graph of the relationships, between an output power and a power-added efficiency (PAE), of the amplifier circuit 10B according to the seventh modified example and the amplifier circuit 500 of the related art. In the amplifier circuit 10B according to the seventh modified example, degradation of power-added efficiency is suppressed in the high output range.

Figure 17C:
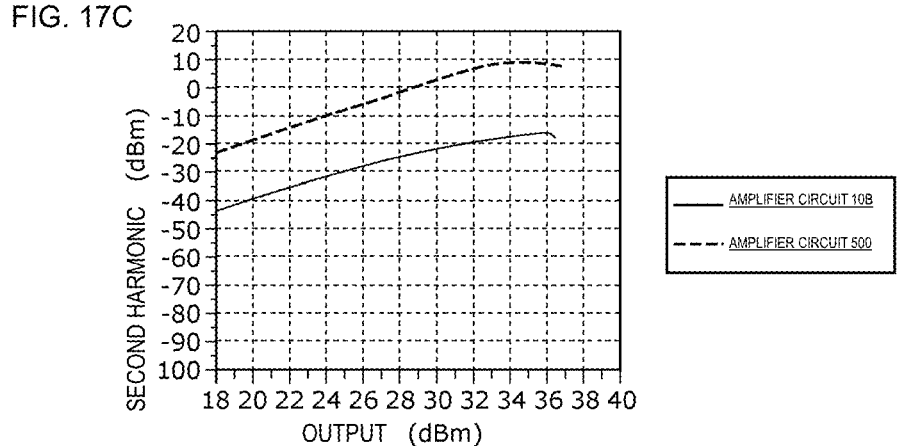
FIG. 17C is a graph of the relationships, between output power and second harmonic, of an amplifier circuit according to the seventh modified example and an amplifier circuit of the related art.

FIG. 17C is a graph of the relationships, between an output power and a second harmonic, of the amplifier circuit 10B according to the seventh modified example and the amplifier circuit 500 of the related art. In the amplifier circuit 10B according to the seventh modified example, the strength of the second harmonic is suppressed in all the output range.

The radio frequency circuit and the amplifier circuit 10B according to the present modified example provide reduction of the phase differences between the carrier amplifiers 11 and 12 and the peak amplifiers 13 and 14, achieving gain improvement, efficiency improvement, and suppression of a harmonic.

[2. Effects and the Like]

As described above, the radio frequency circuit 1 according to the present embodiment includes the carrier amplifiers 11 and 12 and the peak amplifiers 13 and 14, the transformer 21 having the input-side coil 211 and the output-side coil 212, the transformer 22 having the input-side coil 221 and the output-side coil 222, the signal output terminal 200 connected to the first end of the output-side coil 212, the LC series circuit 33, and the capacitor 40. The input-side coil 211 is connected, at its first end, to the output terminal of the carrier amplifier 11, and is connected, at its second end, to the output terminal of the carrier amplifier 12. The input-side coil 221 is connected, at its first end, to the output terminal of the peak amplifier 13, and is connected, at its second end, to the output terminal of the peak amplifier 14. The LC series circuit 33 is connected either between the output terminal of the peak amplifier 13 and the ground or between the output terminal of the peak amplifier 14 and the ground. The capacitor 40 is connected, at its first end, to the second end of the output-side coil 212, and is connected, at its second end, to the first end of the output-side coil 222. The output-side coil 222 is connected, at its second end, to the ground.

According to this, based on the peak amplifiers 13 and 14 being off, the state in which the LC series circuit 33 (used for suppressing a harmonic) suppresses a fundamental wave may be avoided. Therefore, the harmonic may be suppressed without degradation of the transmission characteristics of the fundamental wave, achieving suppression of degradation of the amplification characteristics of the radio frequency circuit 1. Further, placement of the capacitor 40 allows omission of quarter-wavelength transmission lines which are necessary between the peak amplifier 13 and the input-side coil 221 and between the peak amplifier 14 and the input-side coil 221.

In addition, for example, in addition to the configuration of the radio frequency circuit 1, the radio frequency circuit 2 according to the first modified example may further include the inductor 50 which is connected to the output terminal of the peak amplifier 13 and the output terminal of the peak amplifier 14 and which is connected in parallel to the input-side coil 221.

According to this, placement of the inductor 50 in addition to the capacitor 40 allows the phase of output signals from the peak amplifier 13 and the phase of output signals from the peak amplifier 14 to be converted with high accuracy.

In addition, for example, in the radio frequency circuit 1, the LC series circuit 33 may have the inductor 331 and the capacitor 332 which are connected in series to each other. The capacitance value of the capacitor 40 may be less than or equal to twice the capacitance value of the capacitor 332.

According to this, the resonant frequency of the resonant circuit constituted by the LC series circuit 33 and the capacitor 40 may be set higher than the fundamental-wave frequency of signals which are output from the amplifiers. Therefore, based on the peak amplifiers 13 and 14 being off, the state in which the LC series circuit 33 for suppressing the harmonic suppresses the fundamental wave may be avoided with certainty.

In addition, for example, the radio frequency circuit 1 may include the LC series circuit 31 connected between the output terminal of the carrier amplifier 11 and the ground, the LC series circuit 32 connected between the output terminal of the carrier amplifier 12 and the ground, the LC series circuit 33 connected between the output terminal of the peak amplifier 13 and the ground, and the LC series circuit 34 connected between the output terminal of the peak amplifier 14 and the ground.

According to this, while higher harmonics which are output from all the amplifiers are suppressed with high accuracy, suppression of the fundamental wave may be avoided.

In addition, for example, in addition to the configuration of the radio frequency circuit 2, the radio frequency circuit 4 according to the third modified example may further include the inductor 52 which is connected to the output terminal of the carrier amplifier 11 and the output terminal of the carrier amplifier 12 and which is connected in parallel to the input-side coil 211.

According to this, placement of the inductor 52 in addition to the capacitor 40 allows the phase of output signals of the carrier amplifiers 11 and 12 to be converted with high accuracy.

In addition, for example, a radio frequency circuit according to the seventh modified example may include the capacitor 41, which is connected to the output terminal of the carrier amplifier 11 and the output terminal of the carrier amplifier 12 and which is connected in parallel to the input-side coil 211, and the inductor 50, which is connected to the output terminal of the peak amplifier 13 and the output terminal of the peak amplifier 14 and which is connected in parallel to the input-side coil 221.

According to this, the phase differences between the carrier amplifiers 11 and 12 and the peak amplifiers 13 and 14 are reduced, achieving gain improvement, efficiency improvement, and suppression of the harmonic.

In addition, the radio frequency circuit 1A according to the sixth modified example includes the carrier amplifier 16 and the peak amplifier 17, the transformer 26 having the input-side coil 261 and the output-side coil 262, the transformer 27 having the input-side coil 271 and the output-side coil 272, the signal output terminal 200 connected to the first end of the output-side coil 262, the LC series circuit 37, and the capacitor 45. The input-side coil 261 is connected, at its first end, to the output terminal of the carrier amplifier 16, and is connected, at its second end, to the ground. The input-side coil 271 is connected, at its first end, to the output terminal of the peak amplifier 17, and is connected, at its second end, to the ground. The LC series circuit 37 is connected between the output terminal of the peak amplifier 17 and the ground. The capacitor 45 is connected, at its first end, to the second end of the output-side coil 262, and is connected, at its second end, to the first end of the output-side coil 272. The output-side coil 272 is connected, at its second end, to the ground.

According to this, based on the peak amplifier 17 being off, the state in which the LC series circuit 37 for suppressing the harmonic suppresses the fundamental wave may be avoided. Therefore, without degradation of the transmission characteristics of the fundamental wave, the harmonic may be suppressed, achieving suppression of degradation of the amplification characteristics of the radio frequency circuit 1A. Further, placement of the capacitor 45 allows omission of a quarter-wavelength transmission line which is necessary between the peak amplifier 17 and the input-side coil 271.

In addition, for example, in the radio frequency circuit 1A, the LC series circuit 37 may have the inductor 371 and the capacitor 372 which are connected in series to each other. The capacitance value of the capacitor 45 may be less than or equal to twice the capacitance value of the capacitor 372.

According to this, the resonant frequency of the resonant circuit constituted by the LC series circuit 37 and the capacitor 45 may be set higher than the fundamental-wave frequency of signals which are output from the amplifiers. Therefore, based on the peak amplifier 17 being off, the state in which the LC series circuit 37 for suppressing the harmonic suppresses the fundamental wave may be avoided with certainty.

In addition, for example, the radio frequency circuit 1A may include the LC series circuit 36, which is connected between the output terminal of the carrier amplifier 16 and the ground, and the LC series circuit 37, which is connected between the output terminal of the peak amplifier 17 and the ground.

According to this, while higher harmonics, which are output from all the amplifiers, are suppressed with high accuracy, suppression of the fundamental wave may be avoided.

In addition, for example, the radio frequency circuit 1 (1A) may further include the substrate 60. The capacitor 40 (45) may be a surface mount device disposed on the surface of the substrate 60. The output-side coil 212 (262) and the output-side coil 222 (272) may include planar conductors formed on the surface of the substrate 60 or inside the substrate 60. In plan view of the substrate 60, the capacitor 40 (45) may overlap the output-side coil 212 (262); the capacitor 40 (45) may overlap the output-side coil 222 (272).

According to this, wiring connecting the output-side coils 212 (262) and 222 (272) to the capacitor 40 (45) may be made short, achieving highly accurate signal transmission characteristics of the radio frequency circuit 1 (1A) and a reduction in size of the radio frequency circuit 1 (1A).

In addition, for example, the radio frequency circuit 1 (1A) may further include the substrate 60. The capacitor 40 (45) may include a planar conductor formed inside the substrate 60.

According to this, the capacitor 40 (45) is embedded in the substrate 60, achieving a reduction in size of the radio frequency circuit 1 (1A).

In addition, the communication device 8 according to the present embodiment includes the RFIC 7, which processes a radio frequency signal, and the radio frequency circuit 1, which transports a radio frequency signal between the RFIC 7 and the antenna 6.

According to this, the effects of the radio frequency circuit 1 may be achieved in the communication device 8.

OTHER EMBODIMENTS AND THE LIKE

The radio frequency circuit and the communication device according to the embodiment of the present disclosure are described by taking the embodiment and the modified examples. The radio frequency circuit and the communication device according to the present disclosure are not limited to the embodiment and the modified examples described above. Different embodiments, which are implemented by combining any components in the embodiment and the modified examples, modified examples obtained by making, on the embodiment and the modified examples, various changes conceived by those skilled in the art without departing from the gist of the present disclosure, and various devices including the radio frequency circuit and the communication device are encompassed in the present disclosure.

Figure 12:
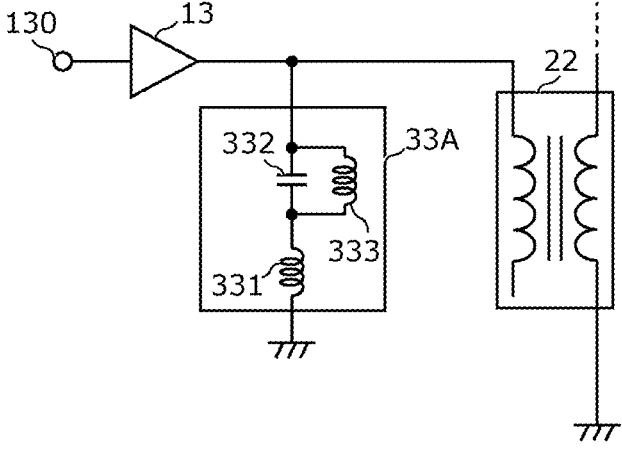
FIG. 12 is a diagram illustrating the circuit configuration of an LC series circuit according to a fifth modified example of the embodiment.

For example, in the radio frequency circuit according to the embodiment and the modified examples, each of the LC series circuits 31 to 34 has an inductor and a capacitor which are connected in series to each other and which are connected between the output terminal of the corresponding amplifier and the ground. However, the configuration is not limited to this. Each of the LC series circuits 31 to 34 may have a circuit device in addition to the inductor and the capacitor which are connected in series to each other. For example, as illustrated in FIG. 12, as in an LC series circuit 33A which is a fifth modified example of the LC series circuit 33, a circuit device may be connected in addition to the inductor 331 and the capacitor 332 which are connected in series to each other. A circuit in which an inductor 333 is connected in parallel to the capacitor 332 is also defined as an LC series circuit according to the present disclosure.

As illustrated in the bandpass characteristics of the amplifier circuit 10 in FIG. 5, the LC series circuit 33, having the inductor 331 and the capacitor 332 which are connected in series to each other, has a function of causing an amplifier to perform a class F operation by making the second wave of an output signal from the amplifier appear short-circuited. However, insertion loss in the fundamental-wave band occurs to some extent. In contrast, in the LC series circuit 33A according to the fifth modified example, adjustment of the inductance value of the inductor 333, which is connected in parallel to the capacitor 332, may cause the LC series circuit 33A to appear open in the fundamental-wave band, and may cause the LC series circuit 33A to appear short-circuited in the second-harmonic band due to the capacitive nature of the capacitor 332. This achieves improvement of bandpass characteristics so that the insertion loss in the second-harmonic band is large and the insertion loss in the fundamental-wave band is minimized.

In addition, for example, in the radio frequency circuit and the communication device according to the embodiment and the modified examples, different circuit devices, different wiring, and the like may be inserted between the circuit devices and between paths connecting signal paths, which are disclosed in the drawings.

INDUSTRIAL APPLICABILITY

The present disclosure may be widely used, in communication devices such as a cellular phone, as a radio frequency circuit disposed in a multiband front-end unit.

REFERENCE SIGNS LIST 1, 1A, 2, 3, 4, 5 radio frequency circuit
6 antenna
7 RF signal processing circuit (RFIC)
8, 9 communication device
10, 10A, 10B, 500, 600 amplifier circuit
11, 12, 16 carrier amplifier
13, 14, 17 peak amplifier
15 preamplifier
21, 22, 26, 27 transformer
31, 32, 33, 33A, 34, 36, 37 LC series circuit
40, 41, 42, 45, 312, 322, 332, 342, 362, 372 capacitor
50, 51, 52, 53, 311, 321, 331, 333, 341, 361, 371 inductor
60 substrate
70 phase-shift circuit
81, 84 switch
82, 83 filter
90 semiconductor IC
93, 94 quarter-wavelength transmission line
101 input terminal
102 antenna connection terminal
110, 120, 130, 140 terminal
200 signal output terminal
211, 221, 261, 271 input-side coil
212, 222, 262, 272 output-side coil

The invention claimed is:

1. A radio frequency circuit comprising:
a first amplifying device, a second amplifying device, a third amplifying device, and a fourth amplifying device;
a first transformer having a first input-side coil and a first output-side coil;
a second transformer having a second input-side coil and a second output-side coil;
a signal output terminal connected to a first end of the first output-side coil;
an LC series circuit; and
a first capacitive device,
wherein each of the first amplifying device and the second amplifying device is a carrier amplifier,
wherein each of the third amplifying device and the fourth amplifying device is a peak amplifier,
wherein the first input-side coil is connected, at a first end thereof, to an output terminal of the first amplifying device, and is connected, at a second end thereof, to an output terminal of the second amplifying device,
wherein the second input-side coil is connected, at a first end thereof, to an output terminal of the third amplifying device, and is connected, at a second end thereof, to an output terminal of the fourth amplifying device,
wherein the LC series circuit is connected either:
between the output terminal of the third amplifying device and a ground, or
between the output terminal of the fourth amplifying device and a ground,
wherein the first capacitive device is connected, at a first end thereof, to a second end of the first output-side coil, and is connected, at a second end thereof, to a first end of the second output-side coil, and
wherein the second output-side coil is connected, at a second end thereof, to a ground.

2. The radio frequency circuit according to claim 1, wherein the first amplifying device and the second amplifying device form a differential amplifier pair, and wherein the third amplifying device and the fourth amplifying device form a differential amplifier pair.

3. The radio frequency circuit according to claim 2, further comprising:
a first inductor that is connected to the output terminal of the third amplifying device and the output terminal of the fourth amplifying device and that is connected in parallel to the second input-side coil.

4. The radio frequency circuit according to claim 3, wherein the LC series circuit has a second inductor and a second capacitive device which are connected in series to each other, and wherein the first capacitive device has a capacitance value which is less than or equal to twice a capacitance value of the second capacitive device.

5. The radio frequency circuit according to claim 4, comprising:
a first LC series circuit connected between the output terminal of the first amplifying device and a ground;
a second LC series circuit connected between the output terminal of the second amplifying device and a ground;
a third LC series circuit connected between the output terminal of the third amplifying device and a ground; and
a fourth LC series circuit connected between the output terminal of the fourth amplifying device and a ground.

6. The radio frequency circuit according to claim 5, further comprising:
a third inductor that is connected to the output terminal of the first amplifying device and the output terminal of the second amplifying device and that is connected in parallel to the first input-side coil.

7. The radio frequency circuit according to claim 6, wherein the LC series circuit has a second inductor and a second capacitive device which are connected in series to each other, and wherein the first capacitive device has a capacitance value less than or equal to twice a capacitance value of the second capacitive device.

8. The radio frequency circuit according to claim 3, further comprising:
a third capacitive device that is connected to the output terminal of the first amplifying device and the output terminal of the second amplifying device and that is connected in parallel to the first input-side coil.

9. The radio frequency circuit according to claim 1, further comprising:

a first inductor that is connected to the output terminal of the third amplifying device and the output terminal of the fourth amplifying device and that is connected in parallel to the second input-side coil.

10. The radio frequency circuit according to claim 1, wherein the LC series circuit has a second inductor and a second capacitive device which are connected in series to each other, and wherein the first capacitive device has a capacitance value which is less than or equal to twice a capacitance value of the second capacitive device.

11. The radio frequency circuit according to claim 1, comprising:

a first LC series circuit connected between the output terminal of the first amplifying device and a ground;

a second LC series circuit connected between the output terminal of the second amplifying device and a ground;

a third LC series circuit connected between the output terminal of the third amplifying device and a ground; and a fourth LC series circuit connected between the output terminal of the fourth amplifying device and a ground.

12. The radio frequency circuit according to claim 11, further comprising:

a third inductor that is connected to the output terminal of the first amplifying device and the output terminal of the second amplifying device and that is connected in parallel to the first input-side coil.

13. The radio frequency circuit according to claim 1, further comprising:

a substrate, wherein the first capacitive device is a surface mount device disposed on a surface of the substrate, wherein the first output-side coil and the second output-side coil include planar conductors formed on the surface of the substrate or inside the substrate, and wherein, in plan view of the substrate, the first capacitive device overlaps the first output-side coil, and the first capacitive device overlaps the second output-side coil.

14. A radio frequency circuit comprising:

a first amplifying device and a second amplifying device;

a first transformer having a first input-side coil and a first output-side coil;

a second transformer having a second input-side coil and a second output-side coil;

a signal output terminal connected to a first end of the first output-side coil;

an LC series circuit; and a first capacitive device, wherein the first amplifying device is a carrier amplifier, wherein the second amplifying device is a peak amplifier, wherein the first input-side coil is connected, at a first end thereof, to an output terminal of the first amplifying device, and is connected, at a second end thereof, to a ground, wherein the second input-side coil is connected, at a first end thereof, to an output terminal of the second amplifying device, and is connected, at a second end thereof, to a ground, wherein the LC series circuit is connected between the output terminal of the second amplifying device and a ground, wherein the first capacitive device is connected, at a first end thereof, to a second end of the first output-side coil, and is connected, at a second end thereof, to a first end of the second output-side coil, and wherein the second output-side coil is connected, at a second end thereof, to a ground.

15. The radio frequency circuit according to claim 14, wherein the LC series circuit has a second inductor and a second capacitive device which are connected in series to each other, and wherein the first capacitive device has a capacitance value less than or equal to twice a capacitance value of the second capacitive device.

16. The radio frequency circuit according to claim 15, comprising:

a first LC series circuit connected between the output terminal of the first amplifying device and a ground; and a second LC series circuit connected between the output terminal of the second amplifying device and a ground.

17. The radio frequency circuit according to claim 16, further comprising:

a substrate, wherein the first capacitive device is a surface mount device disposed on a surface of the substrate, wherein the first output-side coil and the second output-side coil include planar conductors formed on the surface of the substrate or inside the substrate, and wherein, in plan view of the substrate, the first capacitive device overlaps the first output-side coil, and the first capacitive device overlaps the second output-side coil.

18. The radio frequency circuit according to claim 16, further comprising:

a substrate, wherein the first capacitive device includes a planar conductor formed inside the substrate.

19. The radio frequency circuit according to claim 14, comprising:

a first LC series circuit connected between the output terminal of the first amplifying device and a ground; and a second LC series circuit connected between the output terminal of the second amplifying device and a ground.

20. A communication device comprising:

a signal processing circuit that processes a radio frequency signal; and the radio frequency circuit, according to claim 18, that transports the radio frequency signal between the signal processing circuit and an antenna.

* * * * *